US012768647B2

(12) United States Patent
Dunn et al.

(10) Patent No.: US 12,768,647 B2
(45) Date of Patent: Oct. 20, 2026

(54) FLATNESS ERROR RESISTANT PHOTOMASK MEASUREMENT TECHNIQUES

(71) Applicant: CORNING INCORPORATED, Corning, NY (US)

(72) Inventors: Thomas James Dunn, Penfield, NY (US); Steven James Van Kerkhove, Webster, NY (US)

(73) Assignee: CORNING INCORPORATED, Corning, NY (US)

( * ) Notice: Subject to any disclaimer, the term of this patent is extended or adjusted under 35 U.S.C. 154(b) by 51 days.

(21) Appl. No.: 18/945,782

(22) Filed: Nov. 13, 2024

(65) Prior Publication Data

US 2025/0164240 A1 May 22, 2025

Related U.S. Application Data

(60) Provisional application No. 63/600,076, filed on Nov. 17, 2023.

(51) Int. Cl.
*G01B 11/30* (2006.01)
*G03F 7/00* (2006.01)
(Continued)

(52) U.S. Cl.
CPC ........ *G01B 11/303* (2013.01); *G03F 7/70508* (2013.01); *G03F 7/70775* (2013.01);
(Continued)

(58) Field of Classification Search
CPC ................ G01B 11/303; G01B 5/0016; G01B 11/2441; G01B 11/306; G03F 7/70508;
(Continued)

(56) References Cited

U.S. PATENT DOCUMENTS 5,502,566 A * 3/1996 Ai .......................... G01B 11/24 356/514
6,018,990 A 2/2000 Ueki
(Continued)

FOREIGN PATENT DOCUMENTS

JP 5683930 B2 3/2015
KR 10-2011-0089084 A 8/2011
(Continued)

OTHER PUBLICATIONS

Lyu et al, Absolute optical flatness testing by surface shape reconstruction using Zernike polynomials, Sep. 2018, Optical Engineering 57 (9) (Year: 2018).*
(Continued)

*Primary Examiner* — Michael A Lyons
*Assistant Examiner* — Judy Dao Tran
(74) *Attorney, Agent, or Firm* — Amy T. Lang; Ye Eun Park

(57) ABSTRACT

A method of determining a flatness of a substrate, the method including measuring a first flatness measurement of the substrate at a first orientation relative to a vertical direction, measuring a second flatness measurement of the substrate at a second orientation relative to the vertical direction, measuring a third flatness measurement of the substrate at a third orientation relative to a vertical direction, and measuring a fourth flatness measurement of the substrate at a fourth orientation relative to a vertical direction, each of the first orientation, the second orientation, the third orientation, and the fourth orientation being at a different orientation relative to the vertical direction. The method further including generating a first set of differences, fitting the first set of differences to respective orthogonal polynomials, and generating a true flatness of the substrate.

20 Claims, 9 Drawing Sheets

(51) Int. Cl.
*G01B 5/00* (2006.01)
*H10P 74/20* (2026.01)

(52) U.S. Cl.
CPC .. *G01B 5/0016* (2013.01); *G05B 2219/37402* (2013.01); *H10P 74/203* (2026.01)

(58) Field of Classification Search
CPC .... G03F 7/70775; G03F 1/84; G03F 7/70783; G05B 2219/37402; H10P 74/203
See application file for complete search history.

(56) References Cited

U.S. PATENT DOCUMENTS

| | | | | |
|---|---|---|---|---|
| 7,239,376 | B2 * | 7/2007 | Hibbs | G03F 7/70783 355/75 |
| 9,739,590 | B2 | 8/2017 | Han | |
| 10,488,176 | B2 | 11/2019 | Dunn et al. | |
| 10,871,369 | B2 | 12/2020 | Dunn et al. | |
| 2004/0061866 | A1 * | 4/2004 | Sommargren | G01M 11/025 356/497 |
| 2011/0027701 | A1 | 2/2011 | Tanabe | |
| 2013/0182262 | A1 * | 7/2013 | Tang | G01B 9/02076 356/503 |
| 2020/0041248 | A1 | 2/2020 | Dunn et al. | |

FOREIGN PATENT DOCUMENTS

| | | | |
|---|---|---|---|
| KR | 2013-0007088 | A | 1/2013 |
| WO | 2014/076291 | A1 | 5/2014 |

OTHER PUBLICATIONS

Xu et al, Method for absolute flatness measurement of optical surfaces, Apr. 2009, Applied Optics, vol. 48, No. 13, pp. 2536-2541 (Year: 2009).*

Zhai et al, Absolute flat test using rotated and multi-shifted maps with relative tilt measurement, Nov. 2018, Optics and Lasers in Engineering, vol. 114, pp. 121-128 (Year: 2018).*

International Search Report and Written Opinion of the International Searching Authority; PCT/US2024/051487; dated Jan. 30, 2025; 13 pages; European Patent Office.

* cited by examiner

Substrate at 0 deg ($M_0$ Map)

Substrate at 90 deg ($M_{90}$ Map)

$M_{90} - M_0$ Difference Map $M_{90} - M_0$ Difference Map Fit to 2θ Zernike Polynomial $M_{90} - M_0$ Difference Map Fit to 6θ Zernike Polynomial

FLATNESS ERROR RESISTANT PHOTOMASK MEASUREMENT TECHNIQUES

This application claims the benefit of priority under 35 U.S.C. § 120 of U.S. Provisional Application Ser. No. 63/600,076 filed on Nov. 17, 2023, the content of which is relied upon and incorporated herein by reference in its entirety.

FIELD OF TECHNOLOGY

The present disclosure relates generally to photomask measurement and manufacturing, and more specifically to techniques for measuring the flatness of the photomask.

DESCRIPTION OF THE TECHNOLOGY

Optical lithography is a key process used in the fabrication of various electronics, such as microelectronics and integrated circuits, among other examples, and such electronics may have a wide range of industrial, academic, and commercial applications (e.g., computers, vehicles, wearable devices such as smart watches, mobile electronic devices such as smartphones and tablets, and the like). Optical lithography (e.g., extreme ultraviolet (EUV) lithography) may be used to transfer images from a pattern (e.g., a master pattern) on a photomask (e.g., a photolithography mask, a photolithography reticle) to a semiconductor material (e.g., a semiconductor material such as a crystalline silicon material). In some cases, the semiconductor material may include a photo-sensitive coating, such that exposing the photo-sensitive coating may enable one or more processes to be conducted on the semiconductor material. For example, after exposing the photo-sensitive coating, the semiconductor material may be processed to etch the pattern from the photomask into the substrate or to replace the exposed pattern with a new material, among other processes. In some examples, this process may be repeated a quantity of times to create the semiconductor material and ultimately the electronic device (e.g., a final product).

In some cases, a flatness of the photomask may, however, affect an accuracy of the pattern transferred to the semiconductor material. For example, if a flatness of the patterned surface of the photomask deviates from a desired flatness (e.g., a true flatness, an ideal plane), errors may be introduced during the physical patterning of the semiconductor material, such that the semiconductor material may not be patterned according to a desired imaging. In some such cases, the flatness of the photomask may be measured to ensure the flatness satisfies a desired flatness or to ensure the flatness is identified and accounted for during patterning the semiconductor material such that errors in the flatness do not result in errors of the patterned semiconductor material.

SUMMARY

The described techniques relate to improved methods, systems, devices, and apparatuses that support flatness error resistant photomask measurement techniques. Generally, the described techniques are directed to measuring a photomask at various orientations and performing calculations to determine a flatness (e.g., a true flatness) of the photomask. For example, a flatness of the photomask may be measured by one or more interferometers at one or more orientations (e.g., the photomask positioned at a nearly vertical position), and a controller may use the measurements to determine a measurement of the flatness of the photomask, for example, a gravitationally error resistant measurement of the flatness of the photomask. In some such examples, the gravitationally error resistant measurement of the flatness of the photomask may be associated with a flatness of the photomask separate from (e.g., independent from) gravity acting on the photomask. The gravitationally error resistant measurement of the flatness of the photomask may be used for accurately patterning a substrate such that the flatness of the photomask is accounted for, and errors are not induced (e.g., during patterning) on the substrate as a result of deviations in the flatness of the photomask.

According to aspects of the disclosure, a method of determining a flatness of a substrate is disclosed, the method comprising measuring a first flatness measurement of the substrate at a first orientation relative to a vertical direction, measuring a second flatness measurement of the substrate at a second orientation relative to the vertical direction, measuring a third flatness measurement of the substrate at a third orientation relative to a vertical direction, measuring a fourth flatness measurement of the substrate at a fourth orientation relative to a vertical direction, each of the first orientation, the second orientation, the third orientation, and the fourth orientation being at a different orientation relative to the vertical direction, generating a first set of differences between one of the first flatness measurement, the second flatness measurement, the third flatness measurement, and the fourth flatness measurement and another of the first flatness measurement, the second flatness measurement, the third flatness measurement, and the fourth flatness measurement, fitting the first set of differences to respective orthogonal polynomials and generating a fifth flatness measurement, selecting a flatness measurement from the first flatness measurement, the second flatness measurement, the third flatness measurement, and the fourth flatness measurement, replacing orthogonal polynomial components associated with the selected flatness measurement with orthogonal polynomial components associated with the fifth flatness measurement, and generating a true flatness of the substrate.

According to aspects of the disclosure, an apparatus is disclosed, the apparatus comprising a support configured to maintain a substrate at one or more orientations using one or more support members and an interferometer configured to measure a first flatness measurement of the substrate at a first orientation relative to a vertical direction, measure a second flatness measurement of the substrate at a second orientation relative to the vertical direction, measure a third flatness measurement of the substrate at a third orientation relative to a vertical direction, and measure a fourth flatness measurement of the substrate at a fourth orientation relative to a vertical direction, each of the first orientation, the second orientation, the third orientation, and the fourth orientation being at a different orientation relative to the vertical direction. The apparatus further comprising a controller configured to generate a first set of differences between one of the first flatness measurement, the second flatness measurement, the third flatness measurement, and the fourth flatness measurement and another of the first flatness measurement, the second flatness measurement, the third flatness measurement, and the fourth flatness measurement, fit the first set of differences to respective orthogonal polynomials and generating a fifth flatness measurement, select a flatness measurement from the first flatness measurement, the second flatness measurement, the third flatness measurement, and the fourth flatness measurement, replace orthogonal polynomial components associated with the selected flatness measurement with orthogonal polynomial components associated with the fifth flatness measurement, and generate a true flatness of the substrate.

According to aspects of the disclosure, a method of determining a flatness of a substrate is disclosed, the method comprising measuring a first flatness measurement of the substrate at a first orientation relative to a vertical direction, measuring a second flatness measurement of the substrate at a second orientation relative to the vertical direction, generating a difference measurement between the first flatness measurement and the second flatness measurement, fitting the difference measurement to a respective first orthogonal polynomial, selecting a flatness measurement from the first flatness and the second flatness measurement and fitting the selected flatness measurement to a respective second orthogonal polynomial, subtracting the first orthogonal polynomial with the second orthogonal polynomial to generate an error estimation, and generating a true flatness of the photomask based at least in part on the error estimation.

DETAILED DESCRIPTION

Figure 1:
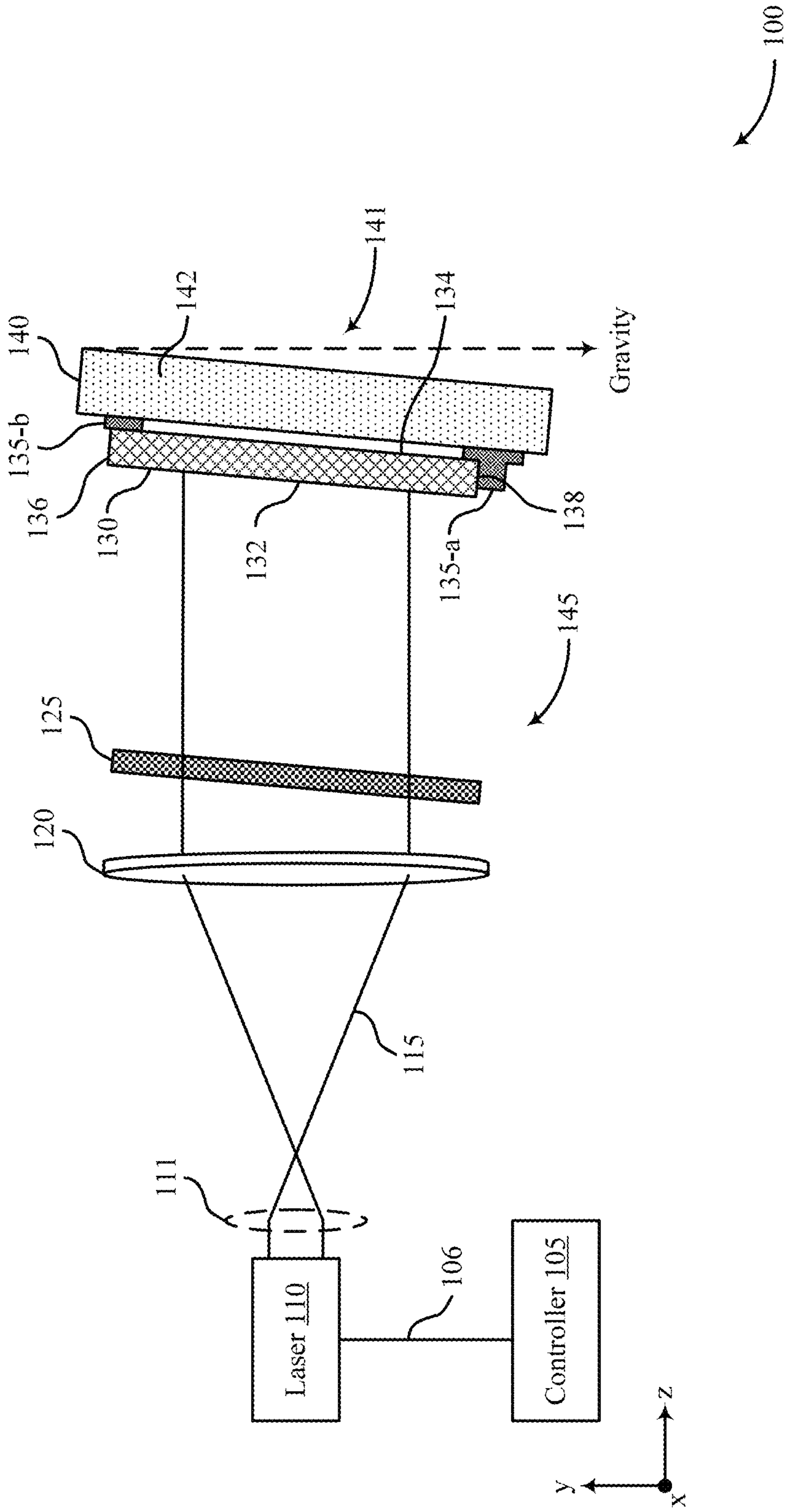
FIG. 1 shows an example of a system that supports flatness error resistant substrate measurement techniques in accordance with aspects of the present disclosure.

A semiconductor material may be patterned through the use of optical lithography to facilitate manufacturing operations for processing the semiconductor material (e.g., during the formation of electronic devices). A substrate, such as a photomask (e.g., a photolithography mask, a reticle) may be implemented to transfer a pattern (e.g., pattern data, images) to the semiconductor material such that the semiconductor material is exposed (e.g., marked) by the pattern. After the semiconductor material is patterned via the substrate, one or more manufacturing operations (e.g., etching, depositing) may be performed in accordance with the pattern to process the semiconductor material and ultimately produce the electronic device. However, deviations in a flatness (e.g., planarity) of the substrate (e.g., from an ideal plane, from a desired flatness) may introduce related deviations (e.g., errors) in the patterning of the semiconductor material when transferring the pattern. Thus, it may be desirable to measure the flatness of the substrate before patterning the semiconductor material, such that deviations in the flatness may be identified and accounted for (e.g., adjusted for) during patterning of the semiconductor material.

In embodiments, determining the flatness of the substrate may include maintaining the substrate at a close proximity to a reference surface with a known flatness. In some such embodiments, a laser source (e.g., a coherent laser source) may illuminate the reference surface and a surface of the substrate at least partially overlapping in time (at least partially concurrently) and an interferometer may measure the flatness of the surface of the substrate by comparing the surface of the substrate to the reference surface. In some examples, a controller may generate one or more interferograms for performing phase measurement interferometry (PMI) on the substrate.

In embodiments, the flatness of a photomask may be measured and determined with relatively reduced or no deviations in flatness (errors in the flatness measurement) due to gravitational force acting on the photomask. That is, the system disclosed herein may separate deviations in the flatness of the photomask induced by the gravitational force from an actual flatness of the photomask, wherein the actual flatness is the true flatness of the photomask. Therefore, in the embodiments disclosed herein, the gravitational component of the flatness measurement is removed from the flatness measurement to provide the true flatness of the photomask.

In embodiments, the flatness of a substrate may be measured at one or more orientations and may then fit the measurements to orthogonal polynomials such as Zernike polynomials to generate an estimation of error associated with the gravitational force. The system may remove the estimation of error from the flatness measurement to determine an error-resistant measurement of the flatness (the true flatness) of the substrate. As is known in the art, Zernike polynomials can be applied to describe mathematically 3-D wavefront deviations. Each Zernike polynomial describes a specific form of surface deviation such that combining two or more Zernike polynomials can describe more complex surface shapes. In principle, by including a sufficient number of Zernike polynomials (commonly referred to as "terms"), any wavefront deformation can be described to a desired degree of accuracy. Each Zernike term is referenced by a polynomial ordering number (0, 1, 2, 3, 4, 5, 6, 7, etc.) and is grouped according to an angular frequency (0) and a radial order. Furthermore, as is also known in the art, the Zernike polynomials may be referred to as "even" or "odd" such that the even Zernike polynomials correspond to polynomials with even angular frequencies (00, 20, 40, 60, etc.) and the odd Zernike polynomials correspond to polynomials with odd angular frequencies (10, 30, 50, 70, etc.).

Aspects of the disclosure are initially described in the context of a system implementing flatness error resistant photomask measurement techniques. Further aspects of the disclosure are described in the context of photomask orientation diagrams, and process flows for a system implementing flatness error resistant photomask measurement techniques. Aspects of the disclosure are further illustrated by and described with reference to a block diagrams and flowcharts that relate to flatness error resistant photomask measurement techniques.

This description provides examples, and is not intended to limit the scope, applicability or configuration of the principles described herein. Rather, the ensuing description will provide those skilled in the art with an enabling description for implementing various aspects of the principles described herein. As can be understood by one skilled in the art, various changes may be made in the function and arrangement of elements without departing from the application.

It should be appreciated by a person skilled in the art that one or more aspects of the disclosure may be implemented in a system to additionally or alternatively solve other problems than those described herein. Further, aspects of the disclosure may provide technical improvements to "conventional" systems or processes as described herein. However, the description and appended drawings only include example technical improvements resulting from implementing aspects of the disclosure, and accordingly do not represent all of the technical improvements provided within the scope of the claims and the disclosure.

FIG. 1 shows an example of a system 100 that provides error resistant photomask measurements for different support positions of the photomask, in accordance with aspects of the present disclosure. In particular, the system 100 includes various measurement components operable to measure a flatness of a substrate 130. For illustrative purposes, aspects of the system 100 may be described with reference to an x-direction, a y-direction, and a z-direction of the illustrated coordinate system. For example, the system 100 may illustrate a side view of the system 100 in an yz-plane. In some examples, the y-direction may be illustrative of a direction opposite to gravitational force, and each of the measurement components may extend for some distance along the x-direction. Although the system 100 illustrates examples of relative sizes and quantities of various features, aspects of the system 100 may be implemented with other relative sizes or quantities of such features in accordance with examples as disclosed herein.

The substrate 130 may be a photomask or a blank, for example. The substrate 130 may be coated glass material or uncoated glass material. As shown in FIG. 1, substrate 130 comprises a first surface 132, a second surface 134, a top surface 136, and a bottom surface 138. System 100 may measure the flatness of the first surface 132 and/or the second surface 134.

The system 100 may include a controller 105 configured to facilitate operations of the system 100. The controller 105 may include one or more processors configured to perform operations in accordance with configurations, algorithms, or programs stored at the controller 105 or an external memory system. For example, the controller 105 may include a non-transitory computer readable medium configured to store instructions including code operable to cause the controller 105 to perform operations with the system 100. The controller 105 may be configured to communicate signaling with an interferometer 145 via, for example, one or more interfaces. For example, the controller 105 may communicate one or more commands to the interferometer 145 to measure the flatness of the substrate 130 (e.g., to collect measurement data associated with a shape of the substrate 130). Additionally, the controller 105 may receive measurements of the flatness of the substrate 130 from the interferometer 145. The interferometer 145 may be, for example, a Fizeau interferometer 145 configured to measure the flatness of the substrate 130 via a quantity of components. For example, the interferometer 145 may include components associated with producing and targeting light at the substrate 130 and components associated with comparing light from the substrate 130 to a reference surface 125 to determine deviations in the flatness of the substrate 130. It is also contemplated, in some embodiments, that system 100 comprises more than one interferometer 145.

The controller 105 may be configured to communicate with the interferometer 145 by signaling with a laser 110 (e.g., a laser light source, a laser diode) via an interface 106 (e.g., a bus) that couples the controller 105 with the laser 110. For example, the controller 105 may communicate one or more commands to the laser 110 (via the interface 106) to initialize performing one or more operations associated with measuring the flatness of the substrate 130. The laser 110 may be configured to output one or more laser beams 115 associated with measuring the flatness of the substrate 130. As shown in FIG. 1, the interferometer 145 may include a focusing element 111 configured to focus the one or more laser beams 115 at one or more optical elements 120. The one or more optical elements 120 of the interferometer may be configured to orient the one or more laser beams 115 at a reference surface 125 or at the first surface 132 of the substrate 130, or both. In some cases, the one or more optical elements 120 may be configured to direct, refract, and/or focus the one or more laser beams 115, such that the one or more laser beams 115 illuminate an entire surface (or a portion thereof) of the reference surface 125 and/or the first surface 132 of the substrate 130. For example, the laser 110 may output the laser beams 115, which may be focused by the focusing element 111, to direct the laser beams 115 at the optical element 120, which may project the laser beams 115 to the reference surface 125 and to the substrate 130.

The reference surface 125 is also known as a Fizeau surface and is a relatively large flat surface with a known flatness. As discussed further below, the reference surface 125 is used as a reference for comparison with substrate 130 in order to determine the flatness of substrate 130. The reference surface 125 may be comprised of fused silica, in some embodiments.

As also shown in FIG. 1, the interferometer 145 further comprises a support 140 to maintain the substrate 130 in a desired position at a desired orientation. The support 140 comprises at least two support members 135-*a*, 135-*b*. Support member 135-*a* may comprise two support members 135-*a*-1 and 135*a*-2 that are each positioned along a bottom surface of substrate 130, as shown in FIGS. 2A-2D. Furthermore, support member 135-*b* may be positioned along a top surface of substrate 130. However, it is also contemplated that the support members 135-*a*-1, 135-*a*-2, and 135-*b* may be positioned along different portions and/or surfaces of substrate 130 than specifically disclosed herein. As shown in FIG. 1, support members 135-*a*-1, 135-*a*-2, and 135-*b* are each a cantilever member extending from a base 142 of support 140. In the embodiments disclosed herein, the support members 135-*a*-1 and 135-*a*-2 only directly contact the bottom surface 138 and a chamfered edge at the bottom of the substrate 130. Furthermore, support member 135-*b* only directly contacts a chambered edge at the top of the substrate 130. Therefore, support members 135-*a*-1, 135-*a*-2, and 135-*b* do not directly contact either the first surface 132 or the second surface 134 of the substrate 130.

The support members 135-*a* and 135-*b* are configured to maintain the substrate 130 a distance from the base 142 of support 140. In some embodiments, the second surface 134 of the substrate 30 is maintained a distance from the base 142 of support 140 while being parallel to the base 142 of support 140.

The support 140 may be maintained at an angle 141 relative to the y-axis vertical direction. Therefore, base 142 may be maintained at the angle 141 relative to the y-axis vertical direction. Because support 140 is maintained at this angle, the substrate 130 is also maintained at the angle 141 relative to the y-axis vertical direction. In particular, angle 141 is defined herein as the angle between the second surface 134 of the substrate 130 and the y-axis vertical direction. Furthermore, angle 141 is also referred to herein as the "tilt angle" of the substrate 130. The value of angle 141 may be adjusted to change the magnitude of the gravitational force acting on the substrate 130, such that larger values of angle 141 correspond to the substrate 130 being slanted to a greater degree relative to the y-axis and that smaller values of angle 141 correspond to the substrate 130 being oriented more vertical along the y-axis.

When the substrate 130 is in a horizontal position, gravity acts on the substrate 130 in a direction orthogonal to surface 132 of the substrate 130. The magnitude of the gravitational force acting on the substrate 130 is relatively less when the substrate 130 is oriented more vertical (when the value of angle 141 is relatively smaller). Furthermore, the flatness measurement of the substrate 130 may be affected by the magnitude of the gravitational force acting on the substrate 130. Substrate 130 is not a completely rigid component and, therefore, is susceptible to deflect when in a horizontal position due to the gravitational force. Stated another way, when the substrate 130 is in a horizontal position, the first surface 132 and the second surface 134 of the substrate 130 may slightly sag downward due to gravity. Although the deflection may be very small, such deflection may cause a traditional interferometer to inaccurately measure the flatness of the substrate. The traditional interferometer may inaccurately consider this deflection from gravity as part of the true flatness of the substrate. However, when the substrate 130 is oriented in a more vertical position (when the value of angle 141 is relatively smaller), it is less susceptible to the gravitational force and, therefore, does not have such sag (or has a reduced amount of sag). Because the magnitude of the gravitational force acting on the substrate 130 is less when the substrate is oriented more vertical, the substrate is also less prone to errors in flatness measurement caused from such gravitational forces.

Although a more vertical orientation of the substrate 130 is beneficial in that it provides more accurate flatness measurements, such must also be balanced with the stability of the substrate 130. The substrate 130 may be subject to relatively more vibrations and greater instability as the value of angle 141 is decreased, such that the substrate 130 is more prone to falling from the support 140. Thus, the value of angle 141 should be balanced to provide accurate measurements while preventing the substrate 130 from falling off the support 140. In embodiments, the value of angle 141 may be maintained between about 1 degree and about 5 degrees (to provide the desirable balance between stability and gravitational influence). The support members 135-*a*-1, 135-*a*-2, and 135-*b*, along with base 142, maintain the substrate 130 at the desired angle 141 between about 1 degree and about 5 degrees. It is noted that even at these ranges of the desired angle 141, the substrate 130 may still experience some deflection from gravity, even though small, for example, a deflection of about 20 nm to about 50 nm.

In embodiments, the interferometer 145 may include one or more light receptive components such that light reflected from the first surface 132 of the substrate 130 may be compared to light reflected from the reference surface 125 to determine differences in shape between the first surface 132 of the substrate 130 and the reference surface 125 (to ultimately measure the true flatness of the substrate 130). For example, the interferometer 145 may include a detector array, which may comprise one or more cameras configured to receive light directed from the first surface 132 of the substrate 130 or the reference surface 125, or both. In some such examples, the interferometer 145 may include one or more refractory lenses configured to direct light reflected from the first surface 132 of the substrate 130 or the reference surface 125, or both, to the detector array.

The controller 105 is configured to modify one or more parameters of the interferometer 145 to determine the shape and flatness of the first surface 132 of substrate 130. For example, the controller 105 may modify a brightness, wavelength, spatial coherence, or angle of illumination of the laser 110. Additionally or alternatively, the controller 105 may modify a number of measurement frames, a size of each measurement frame, or an integration time of the detector array. Additionally or alternatively, the controller 105 may control movements of the support 140 to modify the position or alignment of the support 140 (and, thus, also modify the position or alignment of the substrate 130 with respect to the reference surface 125). For example, the controller 105 may cause the support 140 to pivot to change the angle 141 of the substrate 130. In some embodiments, controller 105 may initiate other subsystems (such as a robot) to remove and reposition the substrate 130 in order to rotate the substrate 130 by, for example, 90 degree increments in its plane.

The flatness measurement of the first surface 132 of the substrate 130 comprises an assessment of the planarity of the first surface 132 and any deformation in such planarity from a completely flat, ideal plane. The substrate 130 itself comprises its true flatness, which is a measurement of the flatness of just the surface of the substrate 130. However, gravitational force acting on the substrate together with the support points 135-*a* and 135-*b* may cause deviations from the true flatness of the substrate. Such forces may cause the flatness measurement to be deviated from its true flatness. More specifically, the magnitude of the gravitational force acting on the substrate may cause the substrate to slightly sag, thus causing the flatness measurement to show a larger deviation from the ideal plane. Therefore, in such cases, the measured flatness of the substrate may be different than the true flatness of the substrate. As discussed further below, measurement errors in the interferometer itself may also cause deviations (errors) in the true flatness measurement of the substrate. It is important to accurately measure the flatness of the substrate in order to pattern a semiconductor material using the substrate, as discussed above. Thus, deviations in the flatness measurement (such as those caused by the gravitational force acting on the substrate or by measurement errors in the interferometer) may introduce unwanted deviations when patterning the semiconductor material.

In accordance with the embodiments disclosed herein, the system 100 is configured to determine the true flatness of the substrate 130 with relatively reduced or no deviations in flatness (errors in the flatness measurement) due to gravitational forces acting on the substrate 130 or from measurement errors from the interferometer. That is, the system 100 may separate deviations in the flatness of the substrate 130 induced by the gravitational forces from the true flatness of the substrate 130. Therefore, in the embodiments disclosed herein, the gravitational component and the interferometer measurement error component of the flatness measurement are removed from the flatness measurement to provide the true flatness of the substrate.

The interferometer 145 according to the embodiments disclosed herein, measures the flatness of the substrate 130 when the substrate is in non-horizontal positions in order to prevent (or reduce) any deflection of the substrate caused by gravitational forces. Furthermore, the interferometer 145 measures the flatness of the substrate 130 at one or more orientations of the substrate and at a tilt angle 141, as discussed further below. After measuring the flatness of the substrate 130 at the one or more orientations, the system 100 (e.g., the controller 105) extracts, for example, Zernike factors from the measurements and uses the Zernike factors to generate an estimation of error associated with the gravitational force. The system may remove the estimation of error from the flatness measurement to determine an error-resistant measurement of the flatness (the true flatness) of the substrate 130. Thus, the system 100 may provide a more accurate measurement of the true flatness of the substrate 130 as compared to traditional interferometers, which can then be used to modify a positioning of patterned data on the substrate 130 such that that the patterned data may be more accurately transferred to a semiconductor material during patterning. Additionally, the system 100 may be configured to account for rotationally symmetric errors in the flatness measurement of the substrate 130, which may have been otherwise unaccounted for with traditional interferometers.

FIGS. 1A-2D show examples of orientation diagrams 200-*a*, 200-*b*, 200-*c*, and 200-*d* in accordance with embodiments of the present disclosure. The orientation diagrams may implement or be implemented by aspects of system 100, as described with reference to FIG. 1. The orientation diagrams depict various orientations for measuring a flatness of the substrate 130. For illustrative purposes, aspects of the orientation diagrams may be described with reference to an x-direction, a y-direction, and a z-direction of the illustrated coordinate system. For example, the orientation diagrams 200-*a*, 200-*b*, 200-*c*, and 200-*d* may illustrate a front view of the substrate 130 in an xy-plane that shows the first surface 132 of the substrate 130. In some examples, the y-direction may be illustrative of a direction opposite to the gravitational forces, and each of the components may extend for some distance along the x-direction or the z-direction, respectively. Although the orientation diagrams illustrate examples of relative sizes and quantities of various features, aspects of the orientation diagrams may be implemented with other relative sizes or quantities of such features in accordance with examples as disclosed herein.

Figure 2A:
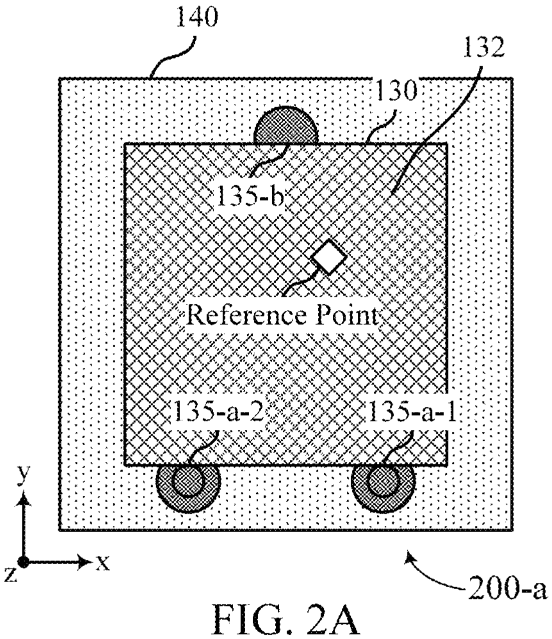
FIGS. 2A, 2B, 2C, and 2D show examples of substrate orientation diagrams that support flatness error resistant substrate measurement techniques in accordance with aspects of the present disclosure.
Figure 2B:
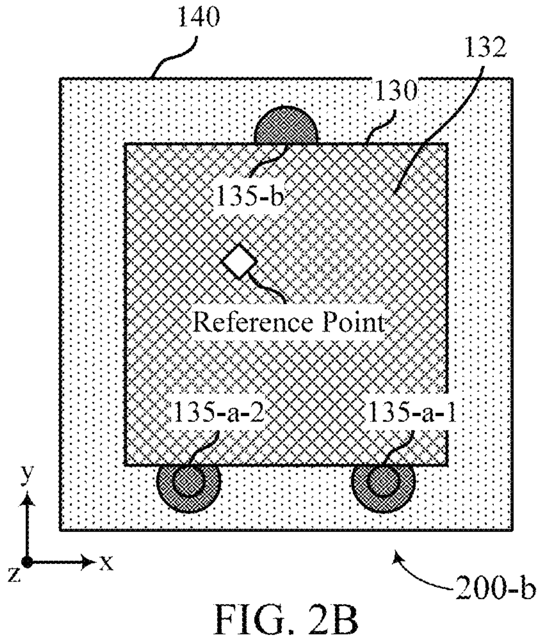
Figure 2C:
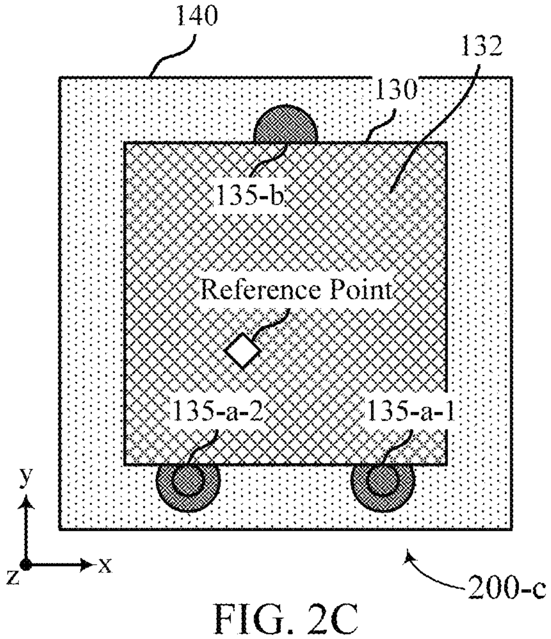
Figure 2D:
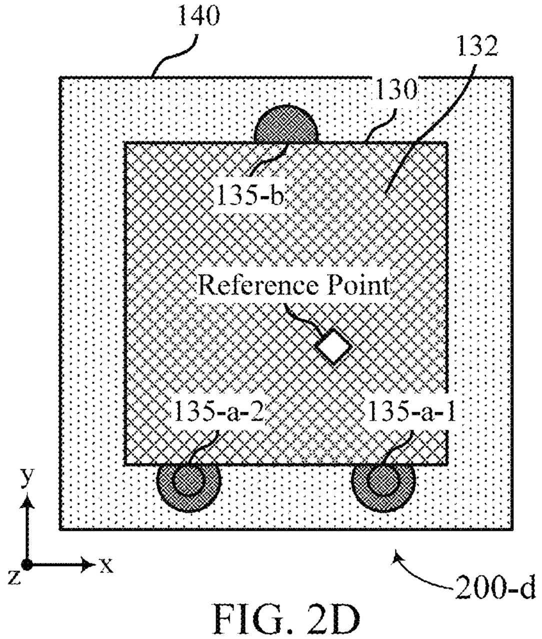

The flatness of the surface of the substrate 130 may be measured at one or more orientations at a tilt angle. Each of the different orientations of the substrate 130 may be separated by a respective degree angle, such as by a 90 degree angle, such that each orientation may represent a 90 degree incremental rotation along an axis (e.g., an axis in the z-direction) normal to a surface of the substrate 130. In other embodiments, the respective degree angle of the different orientations is, for example, 45 degrees, 180 degrees, 270 degrees. However, other angles than those specifically disclosed herein may be used. A robotic mechanism (not shown) may detach the substrate 130 from support 140 to rotate the substrate to a different orientation and then reposition the substrate 130 on the support 140. As shown in FIG. 2A, the substrate 130 is in a first orientation. In this example, the robotic mechanism then picks up the substrate 130 and removes the substrate 130 from the support 140. The robotic mechanism then rotates the substrate 130 90 degrees in a counterclockwise direction and repositions the substrate 130 on the support 140, as shown in FIG. 2B. Therefore, FIG. 2B shows the substrate 130 in a second orientation after it has been rotated. The robotic mechanism may also be used to rotate the substrate 130 to the third orientation of FIG. 2C and to the fourth orientation of FIG. 2D. For illustrative purposes, a reference point is shown in FIGS. 2A-2D to depict the rotation of the substrate 130. The interferometer 145 measures the flatness of the substrate 130 at each orientation of the substrate, as also discussed further below. In some embodiments, the interferometer 145 measures the substrate 130 at four different orientations.

Furthermore, each of the first, second, third, and fourth orientations, as shown in FIGS. 2A-2D, may be at the same tilt angle 141. Therefore, substrate 130 may be maintained at the same angle in each of the orientations. In embodiments, the tilt angle 141 is from about 1 degree to about 5 degrees, or from about 2 degrees to about 4 degrees, or from about 3 degrees to about 5 degrees.

The flatness of the substrate 130 may be measured, via the interferometer 145, at the different orientations to generate respective flatness measurements of the substrate 130. For example, the flatness of the substrate 130 may be measured at the first orientation to generate a first flatness measurement of the substrate 130, the flatness of the substrate 130 may be measured at the second orientation to generate a second flatness measurement of the substrate 130, the flatness of the substrate 130 may be measured at the third orientation to generate a third flatness measurement of the substrate 130, and the flatness of the substrate 130 may be measured at the fourth orientation to generate a fourth flatness measurement of the substrate 130. The controller 105 may use one or more of the first flatness measurement, the second flatness measurement, the third flatness measurement, and/or the fourth flatness measurement to generate the true flatness of the substrate 130 in which deviations in the flatness of the substrate 130 induced by the gravitational force are removed. As discussed above, each of the first, second, third, and fourth orientations may be rotated 90 degrees from each other. Therefore, in embodiments, the first orientation is at 0 degrees, the second orientation is at 90 degrees, the third orientation is at 180 degrees, and the fourth orientation is at 270 degrees. These orientations may be in reference to the reference point, as shown in FIGS. 2A-2D.

Each of the first, second, third and fourth flatness measurements may include deviations (errors), which are removed when calculating the final, true flatness of the substrate 130. For example, the substrate 130 will experience gravitational force when mounted on support 140 (even though the substrate is not in a horizontal position, it may still experience some minor deflection (sag) from gravity). The gravitational force causes deviations in each of the first, second, third, and fourth flatness measurements. Furthermore, the interferometer 145 may have internal inaccuracies (even if minor) that may contribute to the measured flatness of the substrate. As an example, wavefront errors in the interferometer 145 may contribute to the measured flatness. In the embodiments disclosed herein, the deviations and inaccuracies in the first, second, third, and fourth flatness measurements are determined and removed in order to provide the true flatness of the substrate 130.

In equation (1) below, M represents the true flatness of the substrate 130 without any influence from gravitational force or any other wavefront errors, G represents deviation in the true flatness caused from the gravitational force, and W represents deviation in the true flatness caused from the interferometer 145 (such as wavefront errors from the interferometer). The sum of M, G, and W is the measured flatness F. In embodiments, F is the flatness measured by the interferometer 145. As discussed further below, in embodiments of the present disclosure, the deviations in the true flatness caused from the gravitational force (G) is determined and removed from the measured flatness (F) to determine the true flatness (M) of the substrate.

$$F = M + G + W \tag{1}$$

It is noted that, in embodiments, the deviation errors caused from the interferometer (W) may be removed during a calibration process of the interferometer 145, so the value of W may be relatively small (e.g., about 3 nm or less).

Figure 3A:
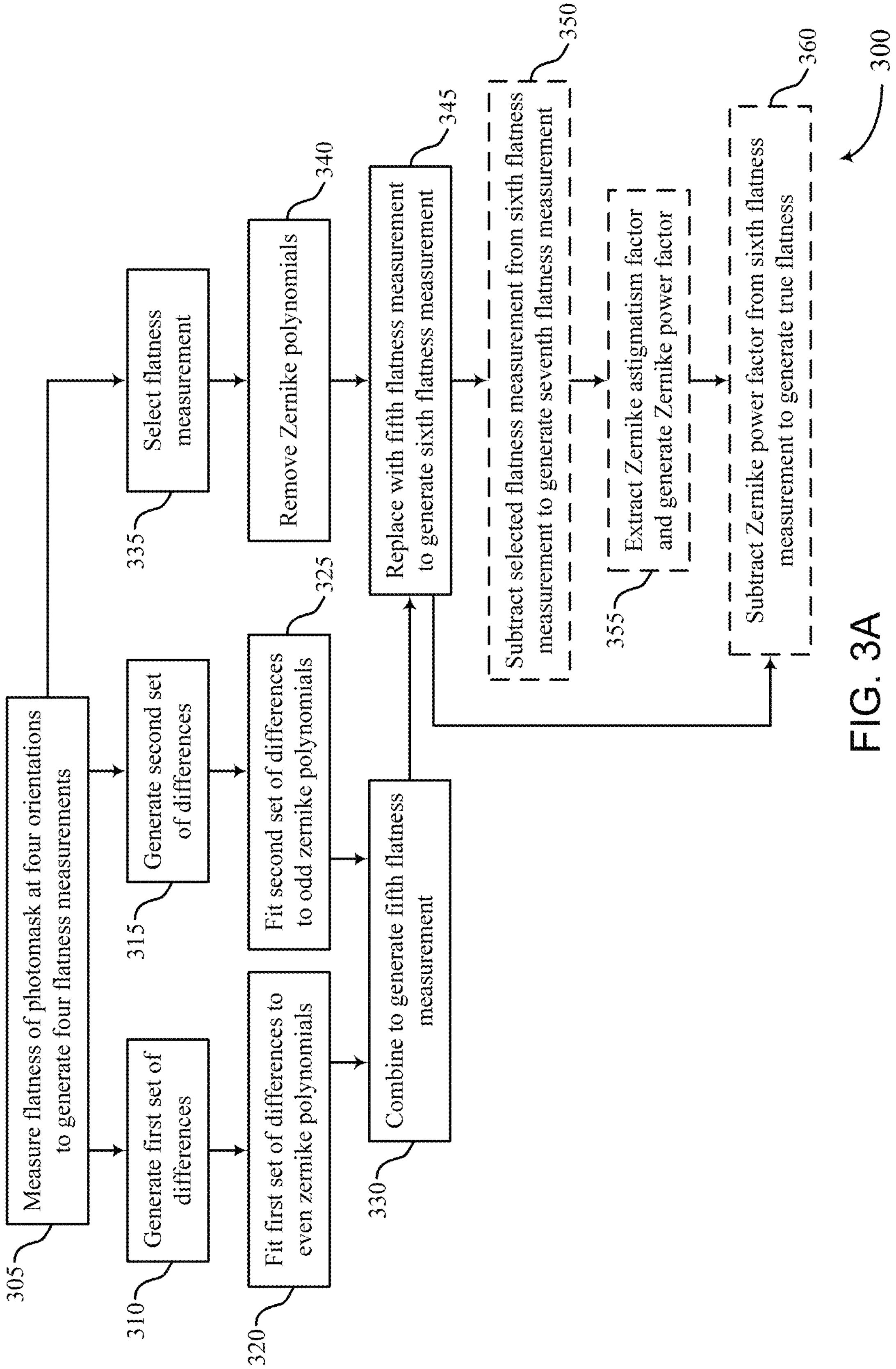
FIG. 3A shows an example of a process flow that supports flatness error resistant substrate measurement techniques in accordance with aspects of the present disclosure.

FIG. 3A shows an example of a process 300 for measuring the true flatness (M) of the substrate 130, in accordance with embodiments of the present disclosure. The process 300 may illustrate aspects of measuring the true flatness of the substrate 130, as described with reference to FIGS. 1-2D. In the following description, the steps of process 300 may be performed in different orders or at different times. For example, some of the steps and techniques described herein may be reordered, arranged, or otherwise rearranged to produce similar results, and the examples provided herein should not be considered limiting to the scope of the disclosure or the claims. For instance, and as described below, one or more aspects of the present disclosure may be performed via a different ordering or combination of steps than those described herein.

At step 305 of process 300, the interferometer 145 measures the flatness of the substrate 130 at one or more different orientations to generate four flatness measurements. In embodiments, the interferometer 145 measures the flatness of the substrate 130 at each of the first, second, third, and fourth orientations to generate the first, second, third, and fourth flatness measurements, respectively. The flatness measurements generated in step 305 may be measured as described herein with reference to FIG. 1, such that the system 100 may perform the measurements. For example, the interferometer 145 may measure and compare light detected from one or more laser beams 115 illuminating surfaces of a reference surface 125 and the first surface 132 of the substrate 130.

It is noted that the first, second, third, and fourth flatness measurements each correspond to the F term in equation (1) above. In particular, as shown in equations (2) through (5) below, $F_1$ corresponds to the first flatness measurement at the first orientation (0 degrees), $F_2$ corresponds to the second flatness measurement at the second orientation (90 degrees), $F_3$ corresponds to the third flatness measurement at the third orientation (180 degrees), and $F_4$ corresponds to the fourth flatness measurement at the fourth orientation (270 degrees). Furthermore, G in each of equations (2) through (5) corresponds to the deviations in the true flatness caused from the gravitational force.

$$F_1 = M_0 + G + W \tag{2}$$

$$F_2 = M_{90} + G + W \tag{3}$$

$$F_3 = M_{180} + G + W \tag{4}$$

$$F_4 = M_{270} + G + W \tag{5}$$

In the above equations, using process 300, the G and W terms are determined and removed from the F term to determine the true flatness (the M term) of the substrate. In order to determine the G term, the different flatness measurement maps generated herein at the different orientations are compared with each other to determine the effect of gravity on the substrate.

At step 310 of process 300, the controller may generate a first set of differences by subtracting one of the first, second, third, and fourth flatness measurements from another of the first, second, third, and fourth flatness measurements. However, the flatness measurements subtracted in step 310 should be rotated 90 degrees relative to each other. Therefore, in embodiments of step 310, the first flatness measurement (which corresponds to a 0 degree orientation) is subtracted from the second flatness measurement (which corresponds to a 90 degree orientation) because the orientations corresponding to these flatness measurements are rotated 90 degrees relative to each other. In embodiments of step 310, the second flatness measurement (which corresponds to a 90 degree orientation) is subtracted from the third flatness measurement (which corresponds to a 180 degree orientation) because the orientations corresponding to these flatness measurements are rotated 90 degrees relative to each other. In embodiments of step 310, the third flatness measurement (which corresponds to a 180 degree orientation) is subtracted from the fourth flatness measurement (which corresponds to a 270 degree orientation) because the orientations corresponding to these flatness measurements are rotated 90 degrees relative to each other. In embodiments of step 310, the fourth flatness measurement (which corresponds to a 270 degree orientation) is subtracted from the first flatness measurement (which corresponds to a 0 degree orientation) because the orientations corresponding to these flatness measurements are rotated 90 degrees relative to each other.

At step 315 of process 300, the controller may generate a second set of differences by subtracting one of the first, second, third, and fourth flatness measurements from another of the first, second, third, and fourth flatness measurements. However, the flatness measurements subtracted in step 315 should be rotated 180 degrees relative to each other. Therefore, in embodiments of step 310, the first flatness measurement (which corresponds to a 0 degree orientation) is subtracted from the third flatness measurement (which corresponds to a 180 degree orientation) because the orientations corresponding to these flatness measurements are rotated 180 degrees relative to each other. In embodiments of step 310, the second flatness measurement (which corresponds to a 90 degree orientation) is subtracted from the fourth flatness measurement (which corresponds to a 270 degree orientation) because the orientations corresponding to these flatness measurements are rotated 180 degrees relative to each other.

It is noted that in each of steps 310 and 315, the controller 105 may perform one or more subtraction calculations between the different flatness measurements. For example, in step 310, controller 105 may only subtract the first flatness measurement from the second flatness measurement to generate the first set of differences. In other embodiments of step 310, the controller 105 may subtract the first flatness measurement from the second flatness measurement and subtract the second flatness measurement from the third flatness measurement to generate the first set of differences. In yet other embodiments of step 310, the controller 105 may subtract the first flatness measurement from the second flatness measurement, subtract the second flatness measurement from the third flatness measurement, subtract the third flatness measurement from the fourth flatness measurement, and subtract the fourth flatness measurement from the first flatness measurement to generate the first set of differences.

It is noted that the more subtraction calculations performed in each of steps 310 and 315 equate to more data, which results in a more accurate determination of the true flatness of the substrate 130.

Various steps of process 300 (such as steps 320 and 325) use orthogonal polynomials to characterize and describe the measurements calculated herein. In embodiments, the orthogonal polynomials utilized may include, for example, Zernike polynomials, Legendre polynomials, and X-Y polynomials. For purposes of the steps of process 300, as shown in FIG. 3A, Zernike polynomials are shown and described. However, the steps of process 300 should not limited to such Zernike polynomials and may use other orthogonal polynomials.

At step 320 of process 300, the first set of differences (as calculated in step 310 above) is fit to the even Zernike polynomials. More specifically, the difference calculated in each of the subtraction calculations of step 310 is fit to the even Zernike polynomials. In one example, the first set of differences in step 310 comprises the following subtraction calculations: (i) first flatness measurement subtracted from the second flatness measurement, (ii) the second flatness measurement subtracted from the third flatness measurement, (iii) the third flatness measurement subtracted from the fourth flatness measurement, and (iv) the fourth flatness measurement subtracted from the first flatness measurement. The calculations of (i)-(iv) are further shown in calculations (6)-(9) below:

$$F_{90} - F_0 = (M_{90} + G + W) - (M_0 + G_1 + W) = M_{90} - M_0 \tag{6}$$

$$F_{180} - F_{90} = (M_{180} + G + W) - (M_{90} + G + W) = M_{180} - M_{90} \tag{7}$$

$$F_{270} - F_{180} = (M_{270} + G + W) - (M_{180} + G + W) = M_{270} - M_{180} \tag{8}$$

$$F_0 - F_{270} = (M_0 + G + W) - (M_{270} + G + W) = M_0 - M_{270} \tag{9}$$

The $M_{90}$-$M_0$, $M_{180}$-$M_{90}$, $M_{270}$-$M_{180}$, and $M_0$-$M_{270}$ maps are then each fit to the even Zernike polynomials in step 320. In particular, in embodiments, the $M_{90}$-$M_0$, $M_{180}$-$M_{90}$, $M_{270}$-$M_{180}$, and $M_0$-$M_{270}$ maps are each fit to the 2θ and 6θ Zernike polynomials to generate even Zernike polynomials for each map. In these embodiments, the even angular frequencies above 6θ are not used due to their very small influence on the shape of the polynomial. Furthermore, in step 320, the maps are not fitted to the 0θ and 4θ Zernike polynomials even though these polynomials are "even" polynomials because the 0θ and 4θ Zernike polynomials are symmetric for 90 degrees and, therefore, cancel out in the above subtractions.

Figure 3B:
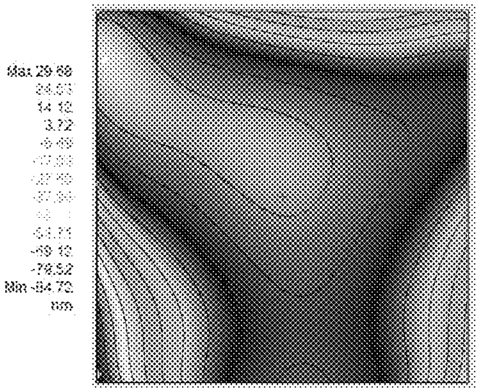
FIGS. 3B and 3C each show exemplary flatness measurement maps in accordance with aspects of the present disclosure.
Figure 3B:
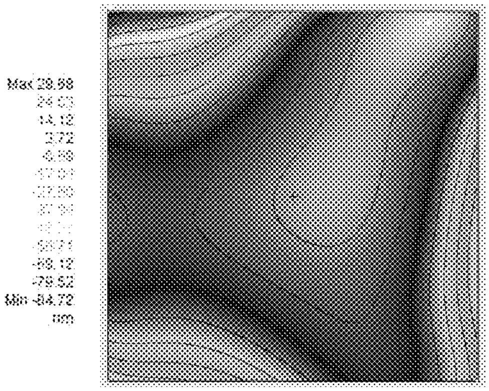
Figure 3B:
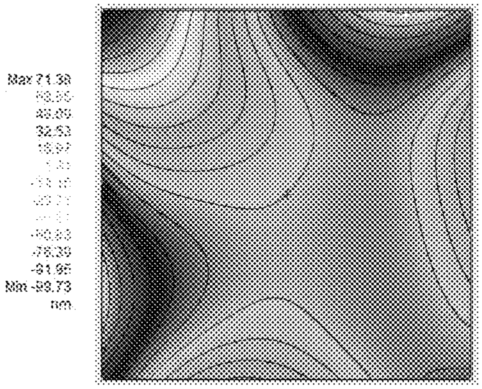
Figure 3B:
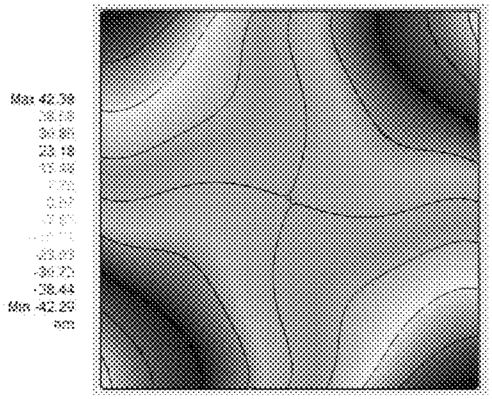
Figure 3B:
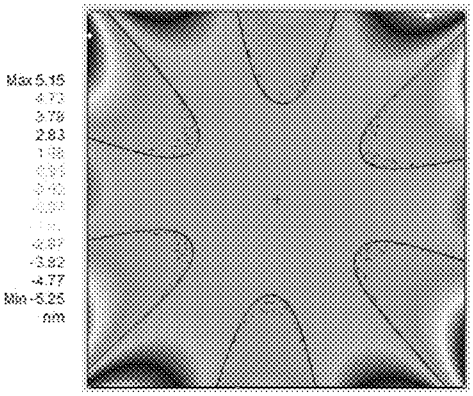

FIG. 3B shows an exemplary $M_{90}$-$M_0$ map fit to the 2θ and 6θ Zernike polynomials to generate even Zernike polynomials for this map. In particular, FIG. 3B shows the $M_0$ and $M_{90}$ maps in the top row and the $M_{90}$-$M_0$ map in the second row of the figure. The third row in the figure shows the $M_{90}$-$M_0$ map fitted to the 2θ Zernike polynomial and the $M_{90}$-$M_0$ map fitted to the 6θ Zernike polynomial. It is noted that the $M_{90}$-$M_0$ map does not look like either the $M_{90}$ or $M_0$ map as it does not have any of the errors associated with the deviations in true flatness caused from the gravitational force G or the deviations in true flatness caused from the interferometer W, as indicated in calculations 6-9 above. It is also noted that the fitted 2θ and 6θ terms from the $M_{90}$-$M_0$ map is the same as the $M_0$ map (but with a different scale factor), as is known by those skilled in the art.

The generated even Zernike polynomials for each map are then averaged together in step 320. In some exemplary embodiments, the calculations (6), (7), (8), and (9) are all used to generate the first set of differences, which are used to generate the even Zernike polynomials in step 320. However, as noted above, only some of the calculations (6), (7), (8), and (9) may be used to generate the first set of differences.

At step 325 of process 300, the second set of differences (as calculated in step 315 above) is fit to the odd Zernike polynomials. More specifically, the difference calculated in each of the subtraction calculations of step 315 is fit to the odd Zernike polynomials. In one example, the second set of differences in step 310 comprises the following subtraction calculations: (v) first flatness measurement subtracted from the third flatness measurement, and (vi) the second flatness measurement subtracted from the fourth flatness measurement. The calculations of (v) and (vi) are further shown in calculations (10) and (11) below:

$$F_{180} - F_0 = (M_{180} + G + W) - (M_0 + G + W) = M_{180} - M_0 \tag{10}$$

$$F_{270} - F_{90} = (M_{270} + G + W) - (M_{90} + G + W) = M_{270} - M_{90} \tag{11}$$

The $M_{180}$-$M_0$ and $M_{270}$-$M_{90}$ maps are then each fit to the odd Zernike polynomials, in step 320. In particular, the $M_{180}$-$M_0$ and $M_{270}$-$M_{90}$ maps are each fit to the 1θ, 3θ, and 5θ Zernike polynomials to generate odd Zernike polynomials for each map. In these embodiments, the even angular frequencies above 5θ are not used due to their very small influence on the shape of the polynomial.

Figure 3C:
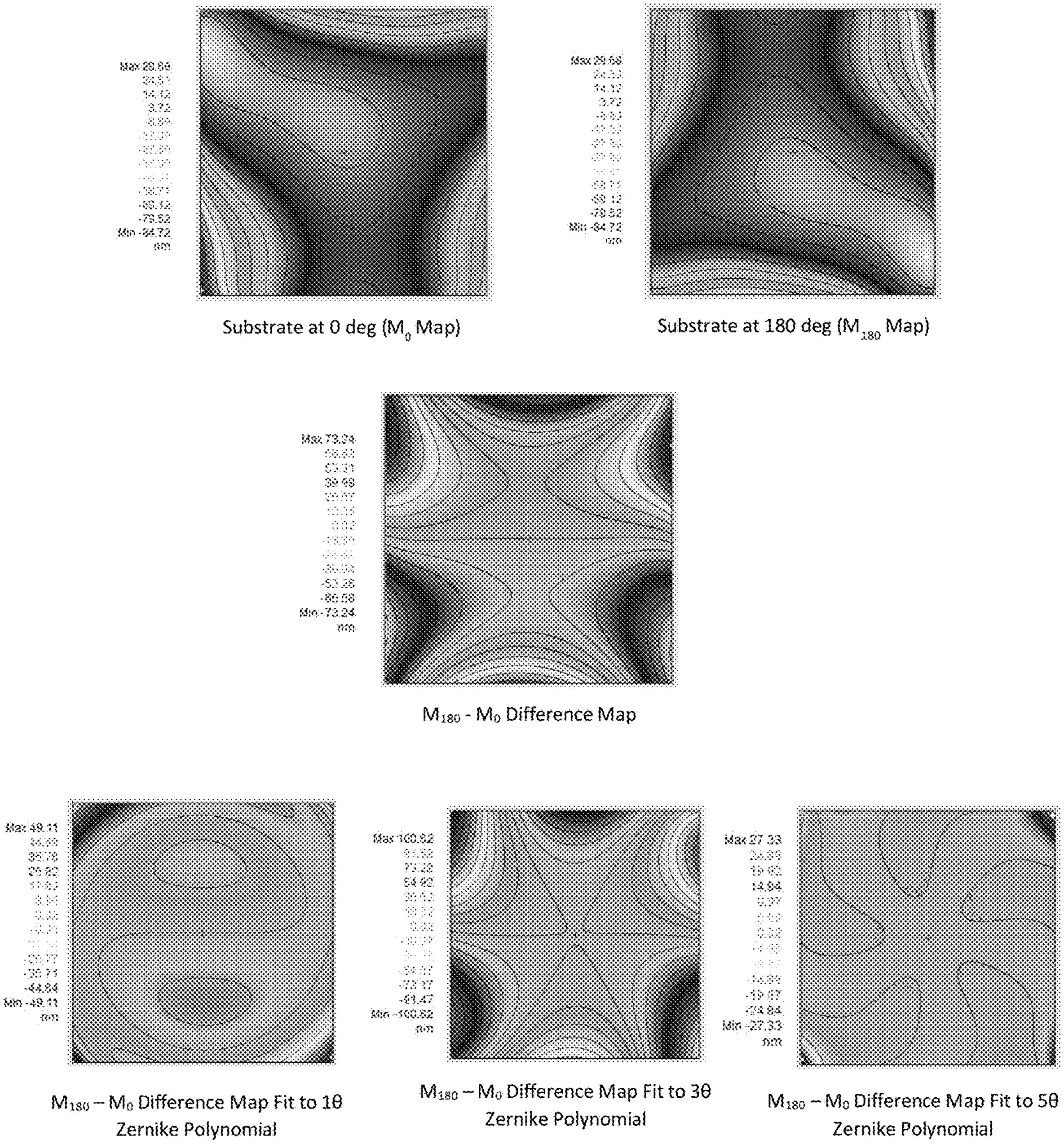

FIG. 3C shows an exemplary $M_{180}$-$M_0$ map fit to the 1θ, 3θ, and 5θ Zernike polynomials to generate odd Zernike polynomials for this map. In particular, FIG. 3C shows the $M_0$ and $M_{180}$ maps in the top row and the $M_{180}$-$M_0$ map in the second row of the figure. The third row in the figure shows the $M_{180}$-$M_0$ map fitted to the 1θ, 3θ, and 5θ Zernike polynomials. It is noted that the $M_{180}$-$M_0$ map does not look like either the $M_{180}$ or $M_0$ map as it does not have any of the errors associated with the deviations in true flatness caused from the gravitational force G or the deviations in true flatness caused from the interferometer W, as indicated in calculations 10 and 11 above. It is also noted that the fitted 1θ, 3θ, and 5θ terms from the $M_{180}$-$M_0$ map is the same as the $M_0$ map (but with a different scale factor), as is known by those skilled in the art.

The generated odd Zernike polynomials for each map are then averaged together. In some exemplary embodiments, the calculations (10) and (11) are both used to generate the second set of differences, which are used to generate the odd Zernike polynomials in step 325. However, as noted above, only one of the calculations (10) and (11) may be used to generate the second set of differences.

At step 330, the controller 105 may combine the averaged even Zernike polynomials from step 320 with the averaged odd Zernike polynomials from step 325 by averaging the polynomials together to generate a fifth flatness measurement. The fifth flatness measurement may comprise the 1θ, 2θ, 3θ, 5θ, and 6θ angular frequencies (noting that the 2θ and 6θ angular frequencies are from step 320 and the 1θ, 3θ, and 5θ angular frequencies are from step 325). In some embodiments, before combining the averaged even Zernike polynomials from step 325 with the averaged odd Zernike polynomials from step 325, the controller 105 may rotate the Zernike polynomials so that the Zernike polynomials are aligned with each other.

At step 335, one of the first, second, third, and fourth flatness measurements is selected, and is then further processed in the subsequent steps of process 300. In some embodiments, the controller 105 selects the flatness measurement in step 335, while in other embodiments a user selects the flatness measurement in step 335. Controller 105 may randomly choose the flatness measurement in step 335 or may make the selection based upon one or more factors. In yet other embodiments, more than one flatness measurement is selected in step 335 and the flatness measurements are averaged together. In exemplary embodiments, the first flatness measurement $F_1$ is selected in step 335.

At step 340, the controller 105 may remove the even and odd Zernike polynomials from the selected flatness measurement of step 335, except for the 0θ and 4θ Zernike terms. Therefore, the 0θ and 4θ Zernike terms remain after the completion of step 340. In one exemplary example, the controller 105 selects the first flatness measurement $F_1$ in step 335, and in step 340, each of the 1θ, 2θ, 3θ, 5θ, and 6θ Zernike terms are removed from the first flatness measurement $F_1$. Therefore, at the completion of step 340, the 0θ and 4θ Zernike terms remain with the first flatness measurement $F_1$.

It is noted that the $F_1$ map does contain the errors associated with the deviations in true flatness caused from the gravitational force G and the deviations in true flatness caused from the interferometer W, as indicated in calculation (2) above. It is also noted that the fitted 1θ, 2θ, 3θ, 5θ, and 6θ terms contain the errors associated with the deviations in true flatness caused from the gravitational force (G) and the deviations in true flatness caused from the interferometer (W), which are removed from the first flatness measurement $F_1$ when the Zernike terms are removed in step 340.

At step 345, the controller 105 replaces the fitted 1θ, 2θ, 3θ, 5θ, and 6θ terms from step 340, which contain the errors associated with G and W, with the fitted 1θ, 2θ, 3θ, 5θ, and 6θ terms from step 330 (the fifth flatness measurement), which do not contain the errors associated with G and W, to generate a sixth flatness measurement. As noted above the fifth flatness measurement is comprised of the 1θ, 2θ, 3θ, 5θ, and 6θ Zernike terms. Therefore, by replacing the Zernike terms of the selected flatness measurement of step 335 with the corresponding fifth flatness measurement terms, the generated sixth flatness measurement is comprised of 1θ, 2θ, 3θ, 4θ, 5θ, and 6θ Zernike terms in which the influence of gravity has been removed from these 1θ, 2θ, 3θ, 5θ, and 6θ Zernike terms.

The sixth flatness measurement of step 345 is an estimated true flatness M of the substrate 130, corresponding to the orientation of the selected flatness from step 335. However, this estimated true flatness is further refined and more accurately calculated with the subsequent steps of process 300. In embodiments, when the first flatness measurement $F_1$ is selected in step 335, the sixth flatness measurement is an estimated true flatness of $M_0$ (wherein the estimated true flatness for this orientation is referred to below as $M_{0'}$). In embodiments, when the second flatness measurement $F_2$ is selected in step 335, the sixth flatness measurement is an estimated true flatness of $M_{90}$. In embodiments, when the third flatness measurement $F_3$ is selected in step 335, the sixth flatness measurement is an estimated true flatness of $M_{180}$. In embodiments, when the fourth flatness measurement $F_4$ is selected in step 335, the sixth flatness measurement is an estimated true flatness of $M_{270}$.

In order to further refine and more accurately calculate the estimated true flatness of step 350, the deviation in true flatness caused from gravitational force G is removed from this estimated value in steps 350-360 of process 300. At step 350, the controller 105 subtracts the selected flatness measurement of step 335 from the sixth flatness measurement to generate the seventh flatness measurement of the substrate. As noted above, in embodiments, the first flatness measurement $F_1$ is selected in step 335 such that the sixth flatness is the estimated true flatness $M_{0'}$. Therefore, in these embodiments, the first flatness measurement $F_1$ is subtracted from the sixth flatness measurement $M_0$, to generate the seventh flatness measurement. This calculation is show in calculation (12) below, such that the first flatness measurement $F_1$ is comprised of $M_0$+G+W, as discussed above.

$$F_1 - M_{0'} = (M_0 + G + W) - M_{0'} = G \tag{12}$$

In calculation (12) above, $M_0$, is an estimate of $M_0$ so that these values are considered to cancel out. Furthermore, the interferometer 145 may be calibrated so that W in calculation 12 above becomes negligible. As shown in calculation (12) above, subtracting the sixth flatness measurement ($M_{0'}$) from the first flatness measurement ($F_1$) produces the seventh flatness measurement, which is equal to G (the deviation in true flatness caused from the gravitational force). Therefore, the seventh flatness measurement is equal to G. But this G term does not comprise the 0θ Zernike term. It is noted that the 0θ Zernike term cancels out in the subtraction of (12) above so that the resulting G lacks the 0θ Zernike term.

In order to correct the 0θ Zernike term in the seventh flatness measurement, the inventors of the present disclosure explored the relationship between the $5^{th}$ order Zernike polynomial (associated with the 2θ term) and the $4^{th}$ order Zernike polynomial (associated with the 0θ term). The inventors discovered that the $4^{th}$ order Zernike polynomial correlates to the $5^{th}$ order Zernike polynomial so that one can predict the $4^{th}$ order Zernike term from the $5^{th}$ order Zernike term. In embodiments, in which the support members 135-*a*, 135-*b* are positioned as shown in FIGS. 2A-2D, the $5^{th}$ order Zernike polynomial is related to the $4^{th}$ order Zernike polynomial by the following relationship: $4^{th}$ order Zernike polynomial=$5^{th}$ order Zernike polynomial times −0.225 (Z4=Z5×−0.225). However, it is noted that this relation may change depending on the location of the support members 135*a*-135*b*.

At step 355, the $5^{th}$ order Zernike polynomial (which is also referred to as the Zernike astigmatism factor) is extracted from the seventh flatness measurement (which is equal to G, as discussed above) in order to determine the $4^{th}$ order Zernike polynomial (which is also referred to as the Zernike power factor) using the relationship disclosed above. Therefore, by determining the $5^{th}$ order Zernike polynomial (associated with the 2θ term), the $4^{th}$ order Zernike polynomial (associated with 0θ term) is also determined. At step 360 of process 300, the $4^{th}$ order Zernike polynomial (the Zernike power factor, which is associated with the 0θ term) is subtracted from the sixth flatness measurement (e.g., the estimated true flatness $M_{0'}$) to produce the true flatness M of the substrate 130. The true flatness M generated in step 360 represents the true flatness of the substrate without the influence of gravity.

After generating the true flatness of the substrate 130, the true flatness may be used to aid in patterning a semiconductor material using the substrate 130. For example, after identifying deviations in the flatness of the substrate 130, the deviations may be accounted for when patterning the semiconductor material. In some examples, accounting for the deviations may include modifying a pattern (e.g., pattern data) that is printed on the substrate 130 to compensate for printing errors that could result from the deviations. In some examples, accounting for the deviations may include modifying a placement of patterned data on the substrate 130 to reduce an impact of deviations of the flatness when patterning the semiconductor material. After accounting for the deviations, the semiconductor material may be patterned using the modified substrate 130. Similarly, the deviations of the flatness can also be transmitted to one or more processors for use in the manufacturing process of substrate, such that the deviations may be reduced during manufacturing. For example, the surface of the substrate 130 may be deterministically polished to remove the deviation of the flatness.

Figure 4:
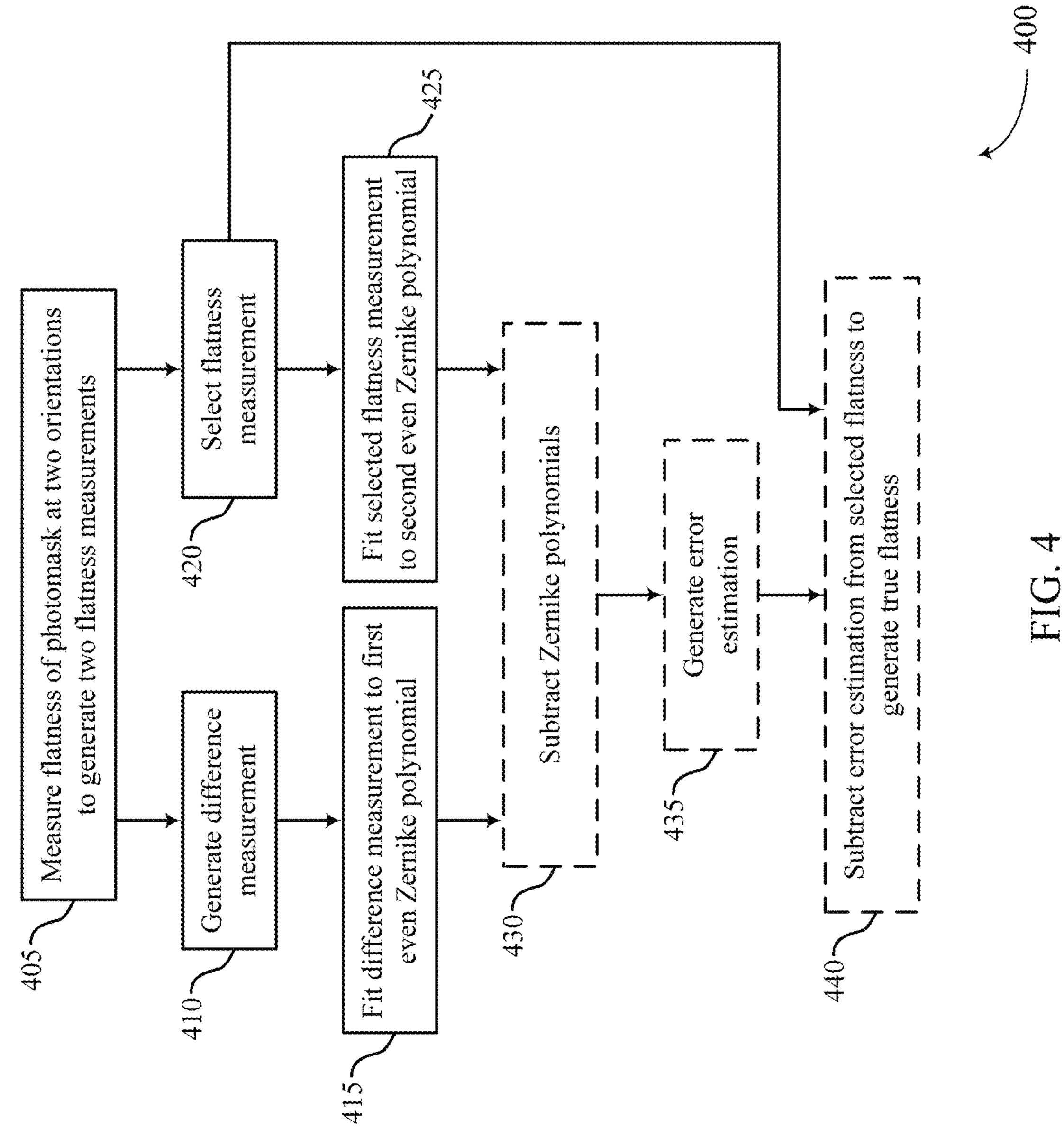
FIG. 4 shows an example of a process flow that supports flatness error resistant substrate measurement techniques in accordance with aspects of the present disclosure.

FIG. 4 shows an example of a process 400 that supports flatness error resistant substrate measurement techniques in accordance with aspects of the present disclosure. The process flow 400 may illustrate aspects of measuring a flatness of a substrate 130, as described with reference to FIGS. 1 and 2A through 2D. The flatness of the substrate 130 may be measured at various orientations as described with reference to the substrate orientation diagrams, and various operations may be performed on the measurements to determine a gravitationally resistant measurement of the flatness of the substrate 130. For example, the process 400 illustrates operations for distinguishing an influence of gravitational force on the flatness of the substrate 130 from an actual flatness of the substrate 130 and this distinguishing is then used in patterning a semiconductor material based on modifying the substrate to account for the influence of the gravitational force. In the following description of the process 400 some methods, techniques, processes, and operations may be performed in different orders or at different times. For example, some of the steps described herein may be reordered or otherwise rearranged to produce similar results. Thus, the process 400 shown in FIG. 4 and described herein may be a non-limiting example of a process for determining an error resistant measurement of the flatness of the substrate 130. Other embodiments in which the steps described herein to generate similar results may therefore be understood as represented by the example shown in the process 400 and described herein. Further, some operation steps may be left out of the process flow 400 or other operation steps may be added to the process 400.

At 405, the interferometer 145 measures the flatness of the substrate 130 at two orientations to generate two of the first, second, third, and fourth flatness measurements, as described with reference to the substrate orientation diagrams of FIGS. 2A-2D. In some embodiments, the interferometer 145 measures the flatness of the substrate 130 at a first orientation to generate the first flatness measurement $F_1$ and at a second orientation to generate the second flatness measurement $F_2$, such that the second orientation is rotated 90 degrees from the first orientation.

At step 410 of process 400, the controller 105 may generate a difference measurement by subtracting one of the first, second, third, and fourth flatness measurements measured in step 405 from the another of the first, second, third and fourth flatness measurements measured in step 405. In the embodiment noted above, the first flatness measurement $F_1$ and the second flatness measurement $F_2$ were measured in step 405. Therefore, in step 410, the first flatness measurement $F_1$ is subtracted from the second flatness measurement $F_2$. This calculation is shown below by calculation (13):

$$F_2 - F_1 = (M_{90} + G + W) - (M_0 + G_1 + W) = M_{90} - M_0 \tag{13}$$

Various steps of process 400 (such as steps 415 and 425) use orthogonal polynomials to characterize and describe the measurements calculated herein. In embodiments, the orthogonal polynomials utilized may include, for example, Zernike polynomials, Legendre polynomials, and X-Y polynomials. For purposes of the steps of process 400, as shown in FIG. 4, Zernike polynomials are shown and described. However, the steps of process 400 should not limited to such Zernike polynomials and may use other orthogonal polynomials.

At step 415 of process 400, the difference measurement (as calculated in step 410) is fit to a first even Zernike polynomial, which in embodiments is the fifth order Zernike polynomial associated with the 2θ term. More specifically, in the embodiment described above, the $M_{90}$-$M_0$ map is fit to the fifth order polynomial associated with the 2θ term.

It is noted that while the $M_{90}$-$M_0$ map does not look like either the $M_{90}$ or $M_0$ map, it does not have any of the errors associated with the deviations in true flatness caused from the gravitational force G or the deviations in true flatness caused from the interferometer W as indicated in calculation 13 above. It is also noted that the fitted 2θ from the $M_{90}$-$M_0$ map is the same as the $M_0$ map (but with a different scale factor), as is known by those skilled in the art.

At step 420, one of the first, second, third, and fourth flatness measurements is selected, and is then further processed in the subsequent steps of process 400. In some embodiments, the controller 105 selects the flatness measurement in step 420, while in other embodiments a user selects the flatness measurement in step 420. Controller 105 may randomly choose the flatness measurement in step 420 or may make the selection based upon one or more factors. In yet other embodiments, more than one flatness measurement is selected in step 420 and the flatness measurements are averaged together. In exemplary embodiments, the first flatness measurement $F_1$ is selected in step 420.

At step 425 of process 400, the selected flatness measurement of step 420 is fit to a second even Zernike polynomial, which in embodiments is the fifth order Zernike polynomial associated with the 2θ term. More specifically, in the embodiment described above, the first flatness measurement $F_1$ is fit to the fifth order Zernike polynomial associated with the 2θ term. It is noted that the $F_1$ map does contain the errors associated with the deviations in true flatness caused from the gravitational force G and the deviations in true flatness caused from the interferometer W, as indicated in calculation (2) above. It is also noted that the fifth order polynomial associated with the 2θ term also contain the errors associated with the deviations in true flatness caused from the gravitational force (G) and the deviations in true flatness caused from the interferometer (W).

At step 430, the first even Zernike polynomial (the fifth order polynomial) of step 415 is subtracted from the second even Zernike polynomial (the fifth order polynomial) of step 425 to generate a fifth order Zernike polynomial associated with the influence from gravitational on the flatness of the substrate G.

At step 435, the controller 105 may generate an error estimation by scaling a predicted model of gravity error. The predicted model of gravity error is generated using a finite element analysis program (FEA program), such as Ansys Simulation Software, to predict the gravity induced error based on a simulation of the gravitational forces acting on a substrate using the support members 135*a*, 135 as shown in FIG. 2A-2D. The scaling factor is a ratio of fifth order Zernike polynomial from step 430 and the fifth order polynomial fit to the predicted model of gravity error. This scaling factor can then be applied to the predicted model so that it correctly matches the expected error from gravitational influence.

At step 440, the controller 105 may subtract the error estimation of step 435 from the selected flatness measurement of step 420 to generate the true flatness M of the substrate. In embodiments, the first flatness measurement $F_1$ was selected in step 420 so that the error estimation is subtracted from the first flatness measurement $F_1$ in step 440. This provides the true flatness M of the substrate 130 without the influence of gravity.

In embodiments, the controller 105 may repeat the steps of process 400 in order to apply the steps to more than one selected flatness measurement. In an example, controller 105 may apply the steps of process 400 in a first application of process 400 wherein the first flatness measurement $F_1$ is selected in step 420 and may apply the steps of process 400 in a second application of process 400 wherein the second flatness measurement $F_2$ is selected in step 420. The true flatness measurements generated in step 440 for each of the first and second applications may then be averaged together. Such may produce a more accurate determination of the true flatness of the substrate 130.

Figure 5:
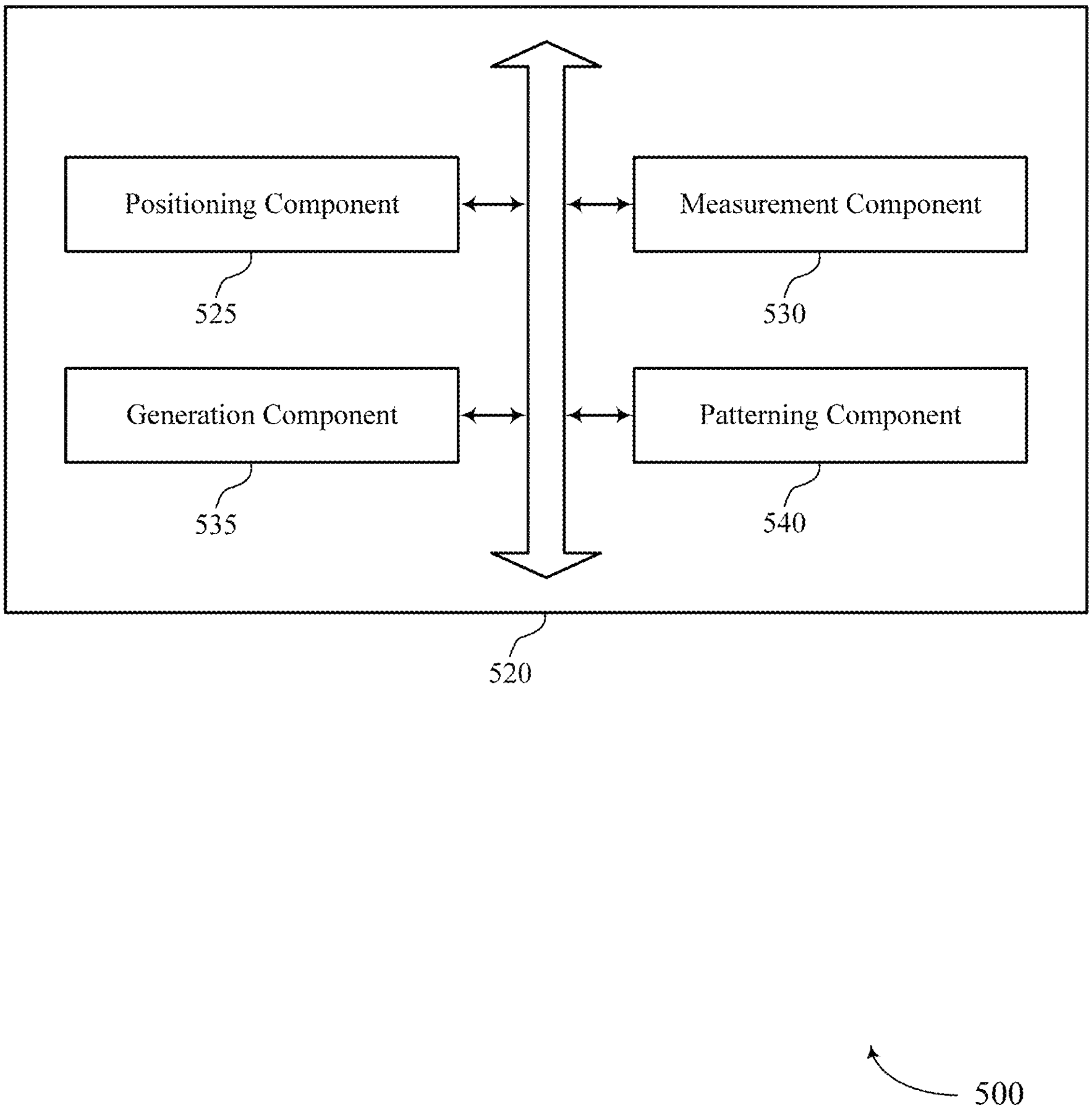
FIG. 5 shows a block diagram of a substrate measurement system that supports flatness error resistant photomask measurement techniques in accordance with aspects of the present disclosure.

FIG. 5 shows a block diagram 500 of a substrate measurement system 520 that supports error resistant substrate measurement techniques for different support positions in accordance with aspects of the present disclosure. The substrate measurement system 520 may be an example of aspects of a substrate measurement system as described with reference to FIGS. 1 through 4. The substrate measurement system 520, or various components thereof, may be an example of means for performing various aspects of error resistant substrate measurement techniques for different support positions as described herein. For example, the substrate measurement system 520 may include a positioning component 525, a measurement component 530, a generation component 535, and a patterning component 540, or any combination thereof. Each of these components may communicate, directly or indirectly, with one another (e.g., via one or more buses).

The positioning component 525 may be configured as or otherwise support a means for positioning a substrate to be in contact with one or more support points. The measurement component 530 may be configured as or otherwise support a means for measuring, via one or more interferometers, the first, second, third, and fourth flatness measurements. The generation component 535 may be configured as or otherwise support a means for generating the difference measurements (of steps 310, 315, and/or 410) and a means for fitting each difference measurement to a respective Zernike polynomial. In some examples, the generation component 535 may be configured as or otherwise support a means for generating an estimation of an error based at least in part on using a scale factor and the difference measurements, the scale factor based on extracting Zernike factors associated with the Zernike polynomial.

In some examples, the patterning component 540 may be configured as or otherwise support a means for patterning a semiconductor material based at least in part on modifying a positioning of patterned data on the substrate based at least in part on using the flatness measurements generated herein.

Figure 6:
FIGS. 6 and 7 show flowcharts illustrating methods that support flatness error resistant photomask measurement techniques in accordance with aspects of the present disclosure.

FIG. 6 shows a flowchart illustrating a method 600 that supports flatness error resistant substrate measurement techniques in accordance with aspects of the present disclosure. The operations of the method 600 may be implemented by a substrate measurement system or its components as described herein. For example, the operations of the method 600 may be performed by a system 100 as described with reference to FIGS. 1 through 5. In some examples, a substrate measurement system may execute a set of instructions to control the functional elements of the substrate measurement system to perform the described functions. Additionally, or alternatively, the substrate measurement system may perform aspects of the described functions using special-purpose hardware.

At 605, the method may include positioning a substrate to be in contact with one or more support points. The operations of 605 may be performed in accordance with examples as disclosed herein. In some examples, aspects of the operations of 605 may be performed by a positioning component 525 as described with reference to FIG. 5.

At 610, the method may include measuring, via an interferometer, a first flatness measurement of the substrate that indicates deformation of the substrate by a gravitational force, the substrate at a first orientation relative to a vertical direction. The operations of 610 may be performed in accordance with examples as disclosed herein. In some examples, aspects of the operations of 610 may be performed by a measurement component 530 as described with reference to FIG. 5.

At 615, the method may include measuring, via the interferometer, a second flatness measurement of the substrate that indicates the deformation of the substrate at a second orientation 90 degrees relative to the first orientation based at least in part on rotating the substrate. The operations of 615 may be performed in accordance with examples as disclosed herein. In some examples, aspects of the operations of 615 may be performed by a measurement component 530 as described with reference to FIG. 5.

At 620, the method may include measuring, via the interferometer, a third flatness measurement of the substrate that indicates the deformation of the substrate at a third orientation that is 180 degrees relative to the first orientation based at least in part on rotating the substrate. The operations of 620 may be performed in accordance with examples as disclosed herein. In some examples, aspects of the operations of 620 may be performed by a measurement component 530 as described with reference to FIG. 5.

At 625, the method may include measuring, via the interferometer, a fourth flatness measurement of the substrate that indicates the deformation of the substrate at a fourth orientation that is 270 degrees relative to the first orientation based at least in part on rotating the substrate. The operations of 625 may be performed in accordance with examples as disclosed herein. In some examples, aspects of the operations of 625 may be performed by a measurement component 530 as described with reference to FIG. 5.

At 630, the method may include generating a first set of differences each based at least in part on a difference between a respective flatness measurement orientation that is 90 degrees relative to another respective flatness measurement. The operations of 630 may be performed in accordance with examples as disclosed herein. In some examples, aspects of the operations of 630 may be performed by a generation component 535 as described with reference to FIG. 5.

At 635, the method may include generating a second set of differences each based at least in part on a difference between a respective flatness measurement orientation that is 180 degrees relative to another respective flatness measurement orientation. The operations of 635 may be performed in accordance with examples as disclosed herein. In some examples, aspects of the operations of 635 may be performed by a generation component 535 as described with reference to FIG. 5.

At 640, the method may include fitting each of the first set of differences to respective even Zernike polynomials and each of the second set of differences to respective odd Zernike polynomials. The operations of 640 may be performed in accordance with examples as disclosed herein. In some examples, aspects of the operations of 640 may be performed by a generation component 535 as described with reference to FIG. 5.

At 645, the method may include generating a fifth flatness of the substrate based at least in part on combining a fit of the first set of differences to respective even Zernike polynomials and a fit of the second set of differences to respective odd Zernike polynomials. The operations of 645 may be performed in accordance with examples as disclosed herein. In some examples, aspects of the operations of 645 may be performed by a generation component 535 as described with reference to FIG. 5.

At 650, the method may include selecting a flatness measurement from the first flatness measurement, the second flatness measurement, the third flatness measurement, or the fourth flatness measurement. The operations of 650 may be performed in accordance with examples as disclosed herein. In some examples, aspects of the operations of 650 may be performed by a generation component 535 as described with reference to FIG. 5.

At 655, the method may include replacing one or both of even Zernike polynomial components and odd Zernike polynomial components associated with the selected flatness measurement using the fifth flatness measurement. The operations of 655 may be performed in accordance with examples as disclosed herein. In some examples, aspects of the operations of 655 may be performed by a generation component 535 as described with reference to FIG. 5.

Figure 7:
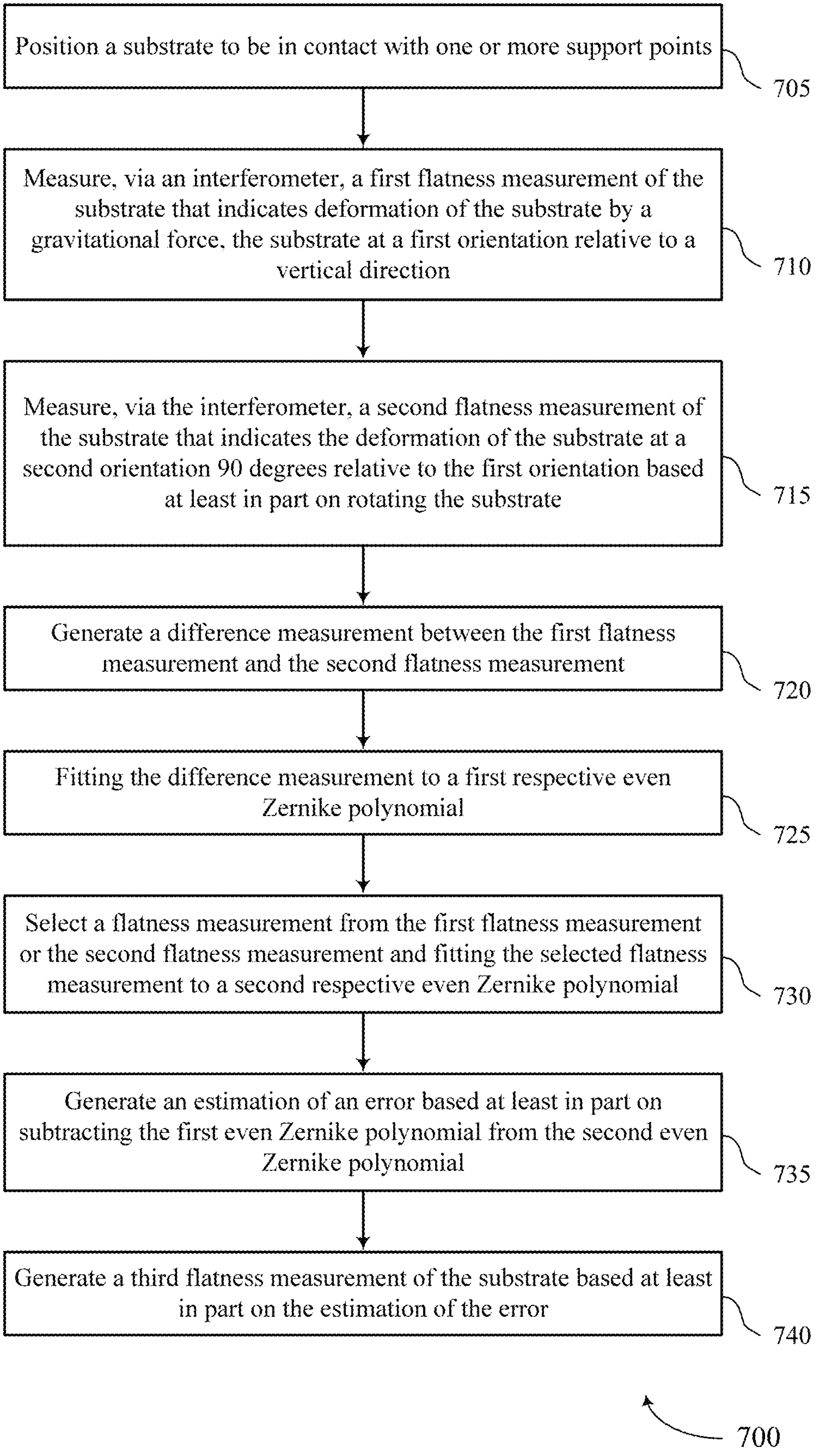

FIG. 7 shows a flowchart illustrating a method 700 that supports flatness error resistant substrate measurement techniques in accordance with aspects of the present disclosure. The operations of the method 700 may be implemented by a substrate measurement system or its components as described herein. For example, the operations of the method 700 may be performed by a system 100 as described with reference to FIGS. 1-5. In some examples, a substrate measurement system may execute a set of instructions to control the functional elements of the substrate measurement system to perform the described functions. Additionally, or alternatively, the substrate measurement system may perform aspects of the described functions using special-purpose hardware.

At 705, the method may include positioning a substrate to be in contact with one or more support points. The operations of 705 may be performed in accordance with examples as disclosed herein. In some examples, aspects of the operations of 705 may be performed by a positioning component 525 as described with reference to FIG. 5.

At 710, the method may include measuring, via an interferometer, a first flatness of the substrate that indicates deformation of the substrate by a gravitational force, the substrate at a first orientation relative to a vertical direction. The operations of 710 may be performed in accordance with examples as disclosed herein. In some examples, aspects of the operations of 710 may be performed by a measurement component 530 as described with reference to FIG. 5.

At 715, the method may include measuring, via the interferometer, a second flatness of the substrate that indicates the deformation of the substrate at a second orientation 90 degrees relative to the first orientation based at least in part on rotating the substrate. The operations of 715 may be performed in accordance with examples as disclosed herein. In some examples, aspects of the operations of 715 may be performed by a measurement component 530 as described with reference to FIG. 5.

At 720, the method may include generating a difference measurement between the first flatness measurement and the second flatness measurement. The operations of 720 may be performed in accordance with examples as disclosed herein. In some examples, aspects of the operations of 720 may be performed by a generation component 535 as described with reference to FIG. 5.

At 725, the method may include fitting the difference measurement to a first respective even Zernike polynomial. The operations of 725 may be performed in accordance with examples as disclosed herein. In some examples, aspects of the operations of 725 may be performed by a generation component 535 as described with reference to FIG. 5.

At 730, the method may include selecting a flatness measurement from the first flatness measurement or the second flatness measurement and fitting the selected flatness measurement to a second respective even Zernike polynomial. The operations of 730 may be performed in accordance with examples as disclosed herein. In some examples, aspects of the operations of 730 may be performed by a generation component 535 as described with reference to FIG. 5.

At 735, the method may include generating an estimation of an error based at least in part on subtracting the first even Zernike polynomial from the second even Zernike polynomial. The operations of 735 may be performed in accordance with examples as disclosed herein. In some examples, aspects of the operations of 735 may be performed by a generation component 535 as described with reference to FIG. 5.

At 740, the method may include generating a third flatness measurement of the substrate based at least in part on the estimation of the error. The operations of 740 may be performed in accordance with examples as disclosed herein. In some examples, aspects of the operations of 740 may be performed by a generation component 535 as described with reference to FIG. 5.

In some examples, an apparatus as described herein may perform a method or methods, such as the method 600 and/or the method 700.

According to a first aspect, a method of determining a flatness of a substrate, the method comprising measuring a first flatness measurement of the substrate at a first orientation relative to a vertical direction, measuring a second flatness measurement of the substrate at a second orientation relative to the vertical direction, measuring a third flatness measurement of the substrate at a third orientation relative to a vertical direction, and measuring a fourth flatness measurement of the substrate at a fourth orientation relative to a vertical direction, each of the first orientation, the second orientation, the third orientation, and the fourth orientation being at a different orientation relative to the vertical direction. The method further comprising generating a first set of differences between one of the first flatness measurement, the second flatness measurement, the third flatness measurement, and the fourth flatness measurement and another of the first flatness measurement, the second flatness measurement, the third flatness measurement, and the fourth flatness measurement, fitting the first set of differences to respective orthogonal polynomials and generating a fifth flatness measurement, selecting a flatness measurement from the first flatness measurement, the second flatness measurement, the third flatness measurement, and the fourth flatness measurement. replacing orthogonal polynomial components associated with the selected flatness measurement with orthogonal polynomial components associated with the fifth flatness measurement, and generating a true flatness of the substrate.

According to a second aspect, the method of the first aspect, wherein the orthogonal polynomials comprise Zernike polynomials.

According to a third aspect, the method of the second aspect, wherein the step of fitting the first set of differences to respective orthogonal polynomials comprises fitting the first set of differences to respective even Zernike polynomials.

According to a fourth aspect, the method of the first or second aspects, wherein the second orientation is 90 degrees relative to the first orientation, the third orientation is 90 degrees relative to the second orientation, and the fourth orientation is 90 degrees relative to the third orientation.

According to a fifth aspect, the method of the first through fourth aspects, wherein generating the first set of differences comprising subtracting one of the first flatness measurement, the second flatness measurement, the third flatness measurement, and the fourth flatness measurement with another of the first flatness measurement, the second flatness measurement, the third flatness measurement, and the fourth flatness measurement such that the subtracted flatness measurements are oriented 90 degrees relative to each other.

According to a sixth aspect, the method of the fifth aspect, further comprising generating a second set of differences between one of the first flatness measurement, the second flatness measurement, the third flatness measurement, and the fourth flatness measurement and another of the first flatness measurement, the second flatness measurement, the third flatness measurement, and the fourth flatness measurement.

According to a seventh aspect, the method of the sixth aspect, wherein generating the second set of differences comprising subtracting one of the first flatness measurement, the second flatness measurement, the third flatness measurement, and the fourth flatness measurement with another of the first flatness measurement, the second flatness measurement, the third flatness measurement, and the fourth flatness measurement such that the subtracted flatness measurements are oriented 180 degrees relative to each other.

According to an eight aspect, the method of the sixth aspect, wherein the orthogonal polynomials comprise Zernike polynomials, and the method further comprising fitting the second set of differences to respective odd Zernike polynomials to generate the fifth flatness measurement.

According to a ninth aspect, the method of the first through eight aspects, further comprising replacing the orthogonal polynomial components associated with the selected flatness measurement with the fifth flatness measurement to generate a sixth flatness measurement and subtracting the selected flatness measurement with the sixth flatness measurement to generate a seventh flatness measurement.

According to a tenth aspect, the method of the ninth aspect, wherein the orthogonal polynomials comprise Zernike polynomials, and the method further comprising extracting a Zernike astigmatism factor associated with gravitational force from the seventh flatness, generating a Zernike power factor associated with gravitational force by multiplying the Zernike astigmatism factor by a scale factor, and subtracting the Zernike power factor from the sixth flatness measurement to generate the true flatness of the substrate.

According to an eleventh aspect, the method of the first through tenth aspects, further comprising selecting a second flatness measurement from the first flatness measurement, the second flatness measurement, the third flatness measurement, and the fourth flatness measurement, and replacing orthogonal polynomial components associated with the selected second flatness measurement with orthogonal polynomial components associated with the fifth flatness measurement.

According to a twelfth aspect, the method of the first through eleventh aspects, wherein generating the first set of differences comprises subtracting the first flatness measurement from the second flatness measurement, subtracting the second flatness measurement from the third flatness measurement, subtracting the third flatness measurement from the fourth flatness measurement, and subtracting the fourth flatness measurement from the first flatness measurement.

According to a thirteenth aspect, the method of the first through twelfth aspects, wherein generating the first set of differences comprises subtracting the first flatness measurement from the second flatness measurement, subtracting the second flatness measurement from the third flatness measurement, subtracting the third flatness measurement from the fourth flatness measurement, and subtracting the fourth flatness measurement from the first flatness measurement, and the method further comprising generating a second set of differences by subtracting the first flatness measurement from the third flatness measurement and subtracting the second flatness measurement from the fourth flatness measurement.

According to a fourteenth aspect, the method of the first through thirteenth aspects, further comprising rotating the substrate to each of the first orientation, the second orientation, the third orientation, the fourth orientation, and the fourth orientation by removing the substrate from a support and reattaching the substrate to the support.

According to a fifteenth aspect an apparatus comprising a support configured to maintain a substrate at one or more orientations using one or more support members and an interferometer configured to measure a first flatness measurement of the substrate at a first orientation relative to a vertical direction, measure a second flatness measurement of the substrate at a second orientation relative to the vertical direction, measure a third flatness measurement of the substrate at a third orientation relative to a vertical direction, and measure a fourth flatness measurement of the substrate at a fourth orientation relative to a vertical direction, each of the first orientation, the second orientation, the third orientation, and the fourth orientation being at a different orientation relative to the vertical direction. The apparatus further comprising a controller configured to generate a first set of differences between one of the first flatness measurement, the second flatness measurement, the third flatness measurement, and the fourth flatness measurement and another of the first flatness measurement, the second flatness measurement, the third flatness measurement, and the fourth flatness measurement, fit the first set of differences to respective orthogonal polynomials and generating a fifth flatness measurement, select a flatness measurement from the first flatness measurement, the second flatness measurement, the third flatness measurement, and the fourth flatness measurement, replace orthogonal polynomial components associated with the selected flatness measurement with orthogonal polynomial components associated with the fifth flatness measurement, and generate a true flatness of the substrate.

According to a sixteenth aspect, the apparatus of the fifteenth aspect, wherein the substrate is a photomask.

According to a seventeenth aspect, the apparatus of the fifteenth or sixteenth aspects, wherein the one or more support members comprise a support member positioned along a top surface of the substrate and a support member positioned along a bottom surface of the substrate.

According to an eighteenth aspect, the apparatus of the fifteenth through seventeenth aspects, wherein the one or more support members are each a cantilever member extending from a base.

According to a nineteenth aspect, the apparatus of the fifteenth through eighteenth aspects, further comprising a reference surface and one or more optical elements.

According to a twentieth aspect, the apparatus of the nineteenth aspect, wherein the reference surface is a Fizeau surface.

According to a twenty-first aspect, the apparatus of the fifteenth through twentieth aspects, wherein the second orientation is 90 degrees relative to the first orientation, the third orientation is 90 degrees relative to the second orientation, and the fourth orientation is 90 degrees relative to the third orientation.

According to a twenty-second aspect, a method comprising measuring a first flatness measurement of the substrate at a first orientation relative to a vertical direction, measuring a second flatness measurement of the substrate at a second orientation relative to the vertical direction, generating a difference measurement between the first flatness measurement and the second flatness measurement, fitting the difference measurement to a respective first orthogonal polynomial, selecting a flatness measurement from the first flatness and the second flatness measurement and fitting the selected flatness measurement to a respective second orthogonal polynomial, subtracting the first orthogonal polynomial with the second orthogonal polynomial to generate an error estimation, and generating a true flatness of the photomask based at least in part on the error estimation.

According to a twenty-third aspect, the method of the twenty-second aspect, wherein the first orthogonal polynomial and the second orthogonal polynomial comprise Zernike polynomials.

According to a twenty-fourth aspect, the method of the twenty-third aspect, wherein the step of fitting the first set of differences to a respective orthogonal polynomial comprises fitting the first set of differences to a respective first even Zernike polynomial, and the step of fitting the second set of differences to a respective orthogonal polynomial comprises fitting the second set of differences to a respective second odd Zernike polynomial.

According to a twenty-fifth aspect, the method of the twenty-second through twenty-fourth aspects, wherein the second orientation is 90 degrees relative to the first orientation.

According to a twenty-sixth aspect, the method of the twenty-second through twenty-fifth aspects, further comprising rotating the substrate to each of the first orientation and the second orientation.

According to a twenty-seventh aspect, the method of the twenty-second through twenty-sixth aspects, further comprising scaling a predicted model of gravity error to generate the error estimation and subtracting the error estimation from the selected flatness measurement to generate the true flatness of the photomask.

It should be noted that these methods describe examples of implementations, and that the operations and the steps may be rearranged or otherwise modified such that other implementations are possible. In some examples, aspects from two or more of the methods may be combined. For example, aspects of each of the methods may include steps or aspects of the other methods, or other steps or techniques described herein. Thus, aspects of the disclosure may provide for consumer preference and maintenance interface.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

The various illustrative blocks and modules described in connection with the disclosure herein may be implemented or performed with a general-purpose processor, a digital signal processor (DSP), an ASIC, a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration). The functions of each unit may also be implemented, in whole or in part, with instructions embodied in a memory, formatted to be executed by one or more general or application-specific processors.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations.

As used herein, including in the claims, "of" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method of determining a flatness of a substrate, the method comprising:
- measuring a first flatness measurement of the substrate at a first orientation relative to a vertical direction;
- measuring a second flatness measurement of the substrate at a second orientation relative to the vertical direction;
- measuring a third flatness measurement of the substrate at a third orientation relative to the vertical direction;
- measuring a fourth flatness measurement of the substrate at a fourth orientation relative to the vertical direction, each of the first orientation, the second orientation, the third orientation, and the fourth orientation being at a different orientation relative to the vertical direction;
- generating a first set of differences between one of the first flatness measurement, the second flatness measurement, the third flatness measurement, and the fourth flatness measurement and another of the first flatness measurement, the second flatness measurement, the third flatness measurement, and the fourth flatness measurement;
- fitting the first set of differences to respective orthogonal polynomials and generating a fifth flatness measurement;
- selecting a flatness measurement from the first flatness measurement, the second flatness measurement, the third flatness measurement, and the fourth flatness measurement;
- replacing orthogonal polynomial components associated with the selected flatness measurement with orthogonal polynomial components associated with the fifth flatness measurement; and
- generating a true flatness of the substrate.

2. The method of claim 1, wherein the orthogonal polynomials comprise Zernike polynomials.

3. The method of claim 2, wherein the step of fitting the first set of differences to respective orthogonal polynomials comprises fitting the first set of differences to respective even Zernike polynomials.

4. The method of claim 1, wherein the second orientation is 90 degrees relative to the first orientation, the third orientation is 90 degrees relative to the second orientation, and the fourth orientation is 90 degrees relative to the third orientation.

5. The method of claim 1, wherein generating the first set of differences comprises subtracting one of the first flatness measurement, the second flatness measurement, the third flatness measurement, and the fourth flatness measurement with another of the first flatness measurement, the second flatness measurement, the third flatness measurement, and the fourth flatness measurement such that the subtracted flatness measurements are oriented 90 degrees relative to each other.

6. The method of claim 5, further comprising generating a second set of differences between one of the first flatness measurement, the second flatness measurement, the third flatness measurement, and the fourth flatness measurement and another of the first flatness measurement, the second flatness measurement, the third flatness measurement, and the fourth flatness measurement.

7. The method of claim 6, wherein generating the second set of differences comprises subtracting one of the first flatness measurement, the second flatness measurement, the third flatness measurement, and the fourth flatness measurement with another of the first flatness measurement, the second flatness measurement, the third flatness measurement, and the fourth flatness measurement such that the subtracted flatness measurements are oriented 180degrees relative to each other.

8. The method of claim 6, wherein the orthogonal polynomials comprise Zernike polynomials, and the method further comprising fitting the second set of differences to respective odd Zernike polynomials to generate the fifth flatness measurement.

9. The method of claim 1, further comprising:
- replacing the orthogonal polynomial components associated with the selected flatness measurement with the fifth flatness measurement to generate a sixth flatness measurement; and
- subtracting the selected flatness measurement with the sixth flatness measurement to generate a seventh flatness measurement.

10. The method of claim 9, wherein the orthogonal polynomials comprise Zernike polynomials, and the method further comprising:
- extracting a Zernike astigmatism factor associated with gravitational force from the seventh flatness measurement;
- generating a Zernike power factor associated with gravitational force by multiplying the Zernike astigmatism factor by a scale factor; and
- subtracting the Zernike power factor from the sixth flatness measurement to generate the true flatness of the substrate.

11. The method of claim 1, further comprising:
- selecting a second flatness measurement from the first flatness measurement, the second flatness measurement, the third flatness measurement, and the fourth flatness measurement; and
- replacing orthogonal polynomial components associated with the selected second flatness measurement with orthogonal polynomial components associated with the fifth flatness measurement.

12. The method of claim 1, wherein generating the first set of differences comprises subtracting the first flatness measurement from the second flatness measurement, subtracting the second flatness measurement from the third flatness measurement, subtracting the third flatness measurement from the fourth flatness measurement, and subtracting the fourth flatness measurement from the first flatness measurement.

13. The method of claim 1, wherein generating the first set of differences comprises subtracting the first flatness measurement from the second flatness measurement, subtracting the second flatness measurement from the third flatness measurement, subtracting the third flatness measurement from the fourth flatness measurement, and subtracting the fourth flatness measurement from the first flatness measurement, and the method further comprising generating a second set of differences by subtracting the first flatness measurement from the third flatness measurement and subtracting the second flatness measurement from the fourth flatness measurement.

14. The method of claim 1, further comprising rotating the substrate to each of the first orientation, the second orientation, the third orientation, and the fourth orientation by removing the substrate from a support and reattaching the substrate to the support.

15. An apparatus, comprising:

a support configured to maintain a substrate at one or more orientations using one or more support members;

an interferometer configured to:

measure a first flatness measurement of the substrate at a first orientation relative to a vertical direction;

measure a second flatness measurement of the substrate at a second orientation relative to the vertical direction;

measure a third flatness measurement of the substrate at a third orientation relative to the vertical direction; and measure a fourth flatness measurement of the substrate at a fourth orientation relative to the vertical direction, each of the first orientation, the second orientation, the third orientation, and the fourth orientation being at a different orientation relative to the vertical direction; and a controller configured to:

generate a first set of differences between one of the first flatness measurement, the second flatness measurement, the third flatness measurement, and the fourth flatness measurement and another of the first flatness measurement, the second flatness measurement, the third flatness measurement, and the fourth flatness measurement;

fit the first set of differences to respective orthogonal polynomials and generate a fifth flatness measurement;

select a flatness measurement from the first flatness measurement, the second flatness measurement, the third flatness measurement, and the fourth flatness measurement;

replace orthogonal polynomial components associated with the selected flatness measurement with orthogonal polynomial components associated with the fifth flatness measurement; and generate a true flatness of the substrate.

16. The apparatus of claim 15, wherein the substrate is a photomask.

17. The apparatus of claim 15, wherein the one or more support members comprise a support member positioned along a top surface of the substrate and a support member positioned along a bottom surface of the substrate.

18. The apparatus of claim 15, wherein the one or more support members are each a cantilever member extending from a base.

19. The apparatus of claim 15, further comprising a reference surface and one or more optical elements.

20. The apparatus of claim 19, wherein the reference surface is a Fizeau surface.

* * * * *